United States Patent [19]

Temple

[11] Patent Number: 4,941,026
[45] Date of Patent: Jul. 10, 1990

[54] SEMICONDUCTOR DEVICES EXHIBITING MINIMUM ON-RESISTANCE

[75] Inventor: Victor A. K. Temple, Clifton Park, N.Y.

[73] Assignee: General Electric Company, Schenectady, N.Y.

[21] Appl. No.: 239,014

[22] Filed: Aug. 26, 1988

Related U.S. Application Data

[63] Continuation of Ser. No. 938,692, Dec. 5, 1986, abandoned.

[51] Int. Cl.[5] ............................................. H01L 29/78
[52] U.S. Cl. ................................. 357/23.4; 357/23.8; 357/56; 357/86; 357/58
[58] Field of Search ..................... 357/23.4, 23.8, 55, 357/56, 86, 58

[56] References Cited

U.S. PATENT DOCUMENTS

| | | |
|---|---|---|
| 3,413,527 | 11/1968 | Davies . |
| 3,851,379 | 12/1974 | Gutknecht et al. .................... 357/56 |
| 3,855,608 | 12/1974 | George et al. . |
| 3,953,879 | 4/1976 | O'Connor-D'Arlach et al. . |
| 4,070,690 | 1/1978 | Wickstrom ......................... 357/23.4 |
| 4,470,059 | 9/1984 | Nishizawa et al. ................. 357/23.4 |
| 4,502,914 | 3/1985 | Trumpp et al. . |
| 4,546,367 | 10/1985 | Schutten et al. ................. 357/23.14 |
| 4,589,193 | 5/1986 | Goth et al. . |
| 4,612,465 | 9/1986 | Schutten et al. ................... 357/23.4 |

OTHER PUBLICATIONS

Hu, Chenming, "A Parametric Study of Power MOSFETS", 10th Power Electronics Specialists Conference, Record, held Jan. 18–22, 1979, pp. 385–395.

Primary Examiner—Joseph E. Clawson, Jr.
Attorney, Agent, or Firm—Robert Ochis; James C. Davis, Jr.; Marvin Snyder

[57] ABSTRACT

An improved conductivity vertical channel semiconductor device includes an insulated gate electrode disposed adjacent a substantial portion of the voltage supporting region. In response to an appropriate bias, the control electrode couples to the electric field originating on charges within the voltage supporting region to reorient the electric field associated with those charges toward the gate electrode and transverse to the direction of current flow through the device. Improved control of the electric field within the voltage supporting region allows the doping concentration, and hence the conductivity of the channel, to be improved without a concomitant decrease in breakdown voltage. Accordingly, the channel width and cell repeat distance of the improved device can be reduced, allowing for an improved current density to be established throughout an overall device cell structure. The charge control region of the voltage supporting layer exhibits an aspect ratio of 0.5.

63 Claims, 17 Drawing Sheets

CONVENTIONAL DEVICE

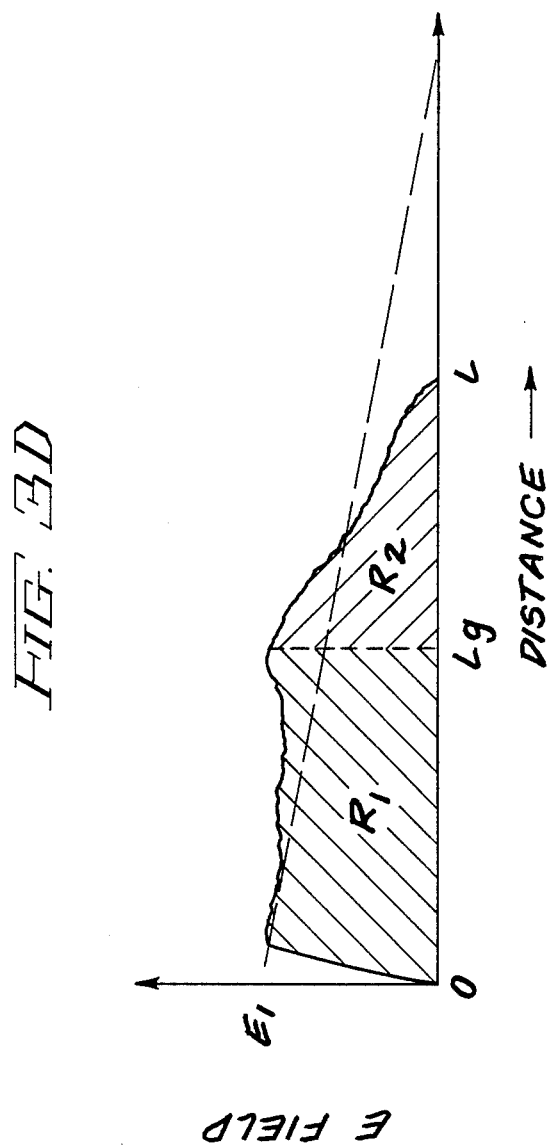

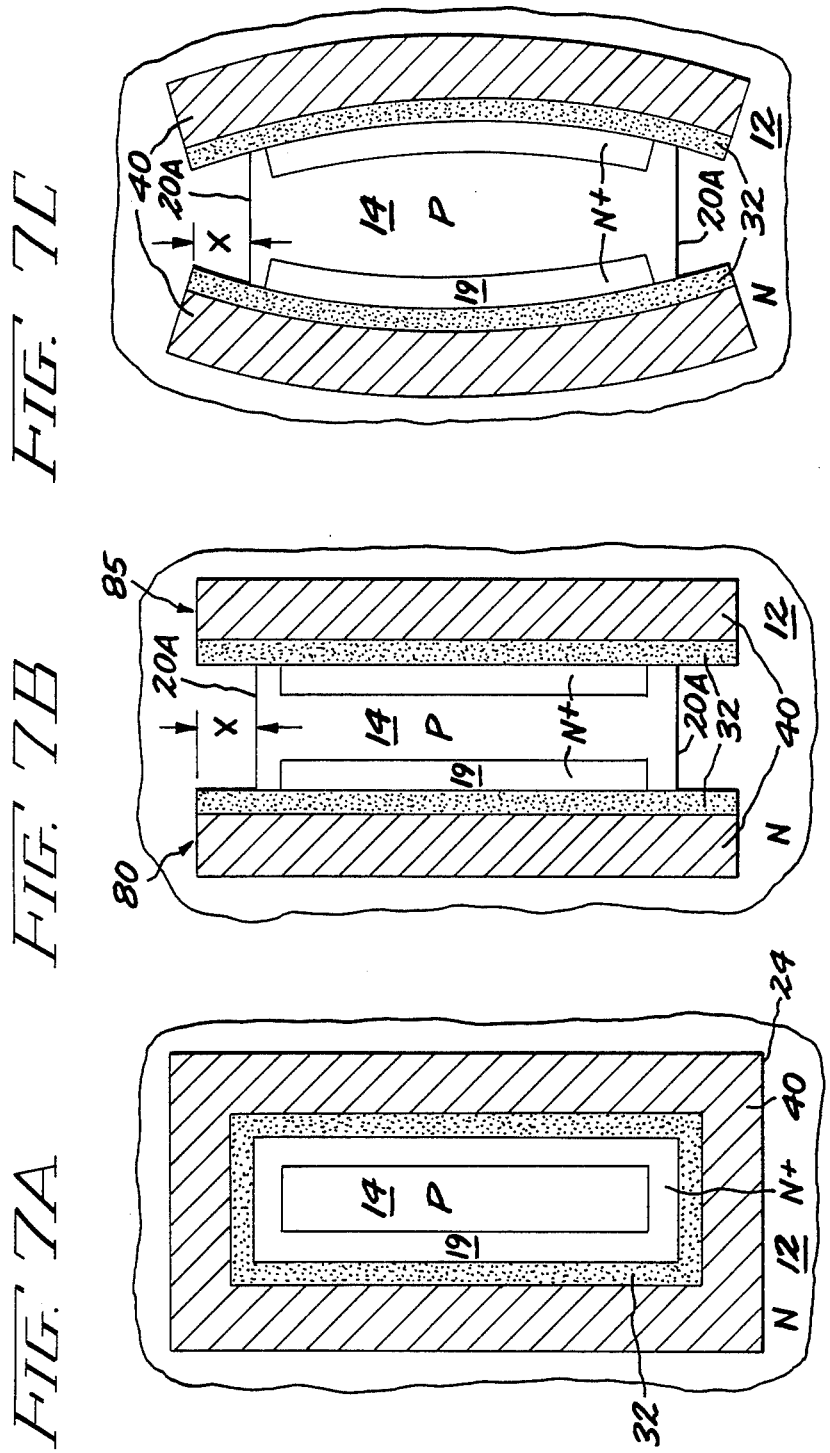

Y-POSITION FROM SURFACE (MICRONS)

Y-POSITION FROM SURFACE (MICRONS)

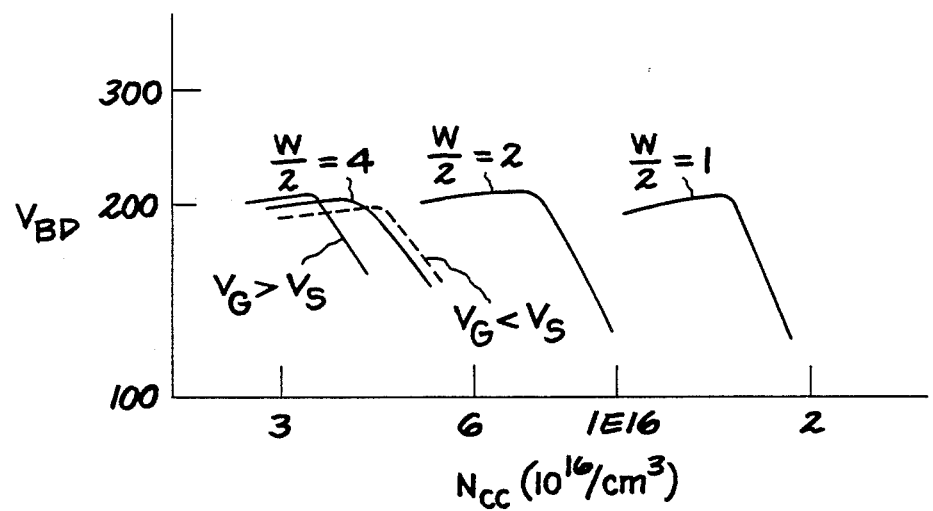

SEMICONDUCTOR DEVICES EXHIBITING MINIMUM ON-RESISTANCE

This application is a continuation of application Ser. No. 938,692, filed Dec. 5, 1986, now abandoned.

This application is related to copending application Ser. No. 938,666 filed concurrently herewith for a "Method of Fabricating A Semiconductor Device Exhibiting Minimum On-Resistance" to V. A. K. Temple, assigned to the assignee hereof and the totality of which is incorporated herein by reference.

The present invention relates to semiconductor devices and more specifically to vertical charge control insulated-gate semiconductor devices exhibiting low on-resistance. The improved insulated gate semiconductor structure can be used to provide improved semiconductor devices such as, Metal Oxide Semiconductor Field Effect Transistors (MOSFETs).

BACKGROUND OF THE INVENTION

Conventional vertical MOSFET devices are constructed to operate within certain predefined narrow limits. For instance, in a conventional device of a specific break-down voltage, the drift region carrier concentration cannot be increased beyond a maximum concentration established by the avalanche electric field. Further, it may not be desirable to increase the dopant concentration to near its maximum limit to reduce the on-resistance of the device because such a dopant increase will also reduce the break-down voltage of the device. Conversely, the drift region carrier concentration cannot be reduced to increase the breakdown voltage without also increasing the on-resistance of the device. Considered in an alternate light, the ideal on-resistance of a conventional device is equal to the length of the drift region divided by the product of mobility, carrier concentration and electron charge. Inasmuch as the avalanche electric field is approximately inversely proportional to the carrier concentration raised to the half power, the on-resistance can be considered proportional to the length of the drift region divided by carrier concentration raised to the 1.5 power. Further, inasmuch as the length of the drift region is proportional to the breakdown voltage, and because the carrier concentration is inversely proportional to the voltage, the ideal on-resistance of a conventional device can be considered proportional to the breakdown voltage, $V_B$, raised to the 2.5 power. Thus, in a one dimensional analysis, the ideal on-resistance of a conventional vertical channel device can be expressed as:

$$R_o \, ON = \frac{L_o}{\mu N_o q} \text{ ohm-cm}^2 \, \alpha \, V_B^{2.5} \tag{1}$$

where $N_o$ is the doping concentration within the drift region and $L_o$ is the depth or length of the drift region.

The above one dimensional conventional on-resistance proportional equation can be derived form the one dimensional expressions of the Gauss's law and the voltage equation for conventional devices which are expressed immediately below as equations (2) and (3), respectively.

$$L_o = \frac{2V_B}{E_{AV}} \tag{2}$$

$$N = \frac{\epsilon E_{AV}^2}{2qV} \text{ or } qN_oL_o = \epsilon E_{AV} \tag{3}$$

where $\mu$ is the mobility of the semiconductor material, $\epsilon$ is the permitivity constant of the semiconductor material and $E_{AV}$ is the avalanche electric field for a drift region doped at N. Thus, in conventional MOSFET devices of which vertical channel devices are a prime example, many of the operating parameters are interrelated and the operating characteristic of a conventional device, such as the breakdown voltage or on-resistance can be varied only over a narrow range of values.

A conventional vertical channel MOSFET device is shown in cross section in FIG. 1 in which a vertical trench, which may contain an insulated gate, extends through an N+ source region, a P base region and across a blocking junction and a short distance $L_t$ into the drift region of the device. The distance $L_t$ by which the trench overlaps into the drift region is optimally small but is typically in the order of 0.5 microns. Some small overlap is provided to ensure that the trench extends completely across the P base region. If the width of a unit cell of the device is specified as W, the ratio of $L_t/W$ will be very small and typically in the order of 0.05. The gate electrode is terminated as close to the blocking junction as possible to reduce fringing fields at the trench corners which otherwise would reduce the device breakdown voltage and the gate-drain breakdown voltage. Thus, the ratio of $L_t/W$ preferably approaches zero. Further, the thickness of the gate oxide within the trench is minimized to achieve a channel of maximum conductivity for minimum gate voltage. In conventional devices, gate oxide thickness are generally in the order of 100–2000 angstroms and allow a gate bias of approximately 1–10 volts to induce a channel by establishing an inversion layer in the region of the semiconductor substrate beneath the gate to render the device conductive in response to the applied gate bias. Gate oxides thicker than 2000 angstroms have not been used in the vertical channel art inasmuch as such a thick oxide would impair the effect of the gate bias, and inhibit the establishment of the requisite inversion layer, or conversely require a larger gate bias to establish the requisite channel conductivity.

OBJECTS OF THE INVENTION

It is therefore an object of the present invention to provide an improved vertical charge control semiconductor device in which the device operating parameters are less interrelated than in prior vertical semiconductor devices, and preferably are decoupled from each other. More particularly, it is an object of the present invention to provide a vertical charge control device in which the on-resistance of the device can be adjusted substantially independent of the breakdown voltage to therefore provide a minimum on-resistance high breakdown voltage device.

A principal object of the present invention is to provide a new and improved insulated-gate semiconductor device capable of reliably controlling a forward current of a relatively high magnitude in comparison to the magnitude of forward current controlled by a conventional device of approximately the same dimensions and breakdown voltage.

Another object of the present invention is to provide a vertical charge control insulated gate semiconductor device in which a substantially vertical trench extends into a first surface of a device and into and through a substantial portion of the drift region to define and typically surround a device pedestal. A commercial device will, of course, comprise one or more trenches which define one or more pedestals. An insulated gate structure is disposed within each trench and lies adjacent the vertical pedestal of the device. The insulated gate extends significantly past a blocking junction of the device to be coextensive with a substantial portion of the drift or voltage supporting region. In a preferred embodiment, the drift or blocking region is heavily doped to reduce the on-resistance of the device. The insulated gate structure provides charge control within the device wherein the electric field associated with the ionized dopant impurities within the pedestal portion of the drift or blocking region of the device is coupled to the insulated gate to thereby increase the reverse bias breakdown potential of the device.

It is therefore an object of the present invention to provide a vertical charge control device in accordance with the present invention which is not constrained to operate within the narrow limits specified by the one dimensional equations (1)-(3) above. Instead, the present invention affords broader flexibility to adjust a single device parameter such as breakdown voltage or on-resistance without significantly impacting other operating parameters of the device. Thus, the device of the present invention can be considered to operate in accordance with the below recited one dimensional ideal expressions for on-resistance, voltage and charge density which is identified below by equations 4, 5 and 6, respectively.

$$R_{ON} = \frac{L}{\mu Nq} = \frac{WV_\beta}{2\mu\epsilon(E_{AV})^2} * \frac{(W + W_T)\text{ohm cm}^2}{W} \quad (4)$$

$$L = \frac{V_\beta}{E_{AV}} \quad (5)$$

$$N = \frac{2\epsilon E_{AV}}{qW} \quad (6)$$

where $\mu$ is the mobility of the semiconductor material and $\epsilon$ is the permittivity of the semiconductor material, $E_{AV}$ is the electric field at avalanche breakdown, q is the electron charge, N is the carrier concentration within the drift layer, W is the width of the pedestal, L is the length of the drift region extending between the base and substrate regions which are respectively contiguous to the source and drain electrodes of the device, $W_T$ is the width of the trench. Clearly, the device of the present invention affords a greater flexibility to establish devices within a broader range of on-resistance and breakdown voltages. These equations are directed to a simplified and ideal embodiment of a device in accordance with the present invention. As will be discussed in detail below, changes in the structure of the device can be made to improve device performance and hence modification of these ideal equations may be necessary to allow these equations to accurately reflect the operation of a particular device.

More particularly, it is an object of the present invention to provide an insulated gate or charge control electrode which extends proximate the perimeter of a significant portion of the pedestal of the device while being separated therefrom by an oxide layer. The insulated charge control electrode extends across the blocking junction and proximate a substantial portion of the blocking or drift region of the device. When the device is in its reverse biased blocking state, the gate electrode can be allowed to float, but preferably is appropriately biased to prevent the channel from conducting. The electric field lines originating on the ionized impurities in the drift region of the pedestal are diverted from their conventional orientation in the direction of on-state current flow, which would normally be vertical or toward the other regions of the device and are reoriented substantially parallel to the upper surface of the device, away from the other device regions, toward the gate electrode and thus transverse to the direction of on-state current flow.

Another object of the present invention is to provide a vertical charge control insulated gate semiconductor device wherein the insulated gate structure adjacent the pedestal includes an insulation layer which is thicker adjacent a lower portion of the drift region and thinner adjacent the channel region and upper portion of the drift region of the device. It is preferred that the transition from the thin portion to the thick portion be made as a non-abrupt gradual transition which can extend either over the entire depth of the trench or over a small portion thereof proximate the blocking junction.

Another object of the present invention is to provide a vertical charge control semiconductor device in which the device breakdown voltage is not inversely proportional to carrier concentration in the blocking region of the device but is substantially independent of drift region doping density.

A still further object of the present invention is to provide a vertical charge control semiconductor device in which the carrier concentration in the blocking region is inversely proportional to the width of the device pedestal.

A still further object of the present invention is to increase the doping concentration within the blocking region of a vertical charge control semiconductor device to reduce the on-resistance while maintaining the peak electric field at less than a predesignated critical field value $E_{AV}$ at which point avalanche breakdown occurs.

It is a further object of the present invention to provide an insulated-gate controlled vertical charge control semiconductor device having low on-resistance, a high breakdown voltage and a blocking region having aspect ratio $L_g/W$, which is greater than or equal to 0.5 and preferably greater than or equal to 1 where $L_g$ is the length of the gate electrode disposed within the trench measured between the blocking junction and the lower edge of the gate electrode and W is the width of the pedestal measured between adjacent trenches.

In a device of the present invention, it is also preferred that the product of the channel width W and doping density N remain approximately constant and be in the order of 0.5-4E12/cm² and preferably 2-3E12/cm² such that as the width of the pedestal is increased, the doping density within the pedestal is decreased.

A more specific object of the present invention is to provide for a new and improved insulated-gate device having a low on-resistance or an on-resistance of less than 1 mΩcm² at a 60 volt rating and an on-resistance of less than 5 mΩ cm² at a 200 volt rating.

SUMMARY OF THE INVENTION

These and other objects and features of the present invention are achieved in a vertical charge control semiconductor device which in a preferred embodiment, comprises a first layer of semiconductor material and a second layer of semiconductor material disposed thereon. In a preferred diode embodiment, the second layer can comprise one type conductivity material and the first layer can comprise opposite type conductivity material. In other embodiments, the second layer can comprise material of one or the opposite type conductivity. In an insulated gate device embodiment, the second layer can be of one type conductivity and a further region of opposite type conductivity can be provided within the second layer. One or more additional layers can be provided beneath the first layer, depending on the exact type insulated gate device to be constructed. A trench is disposed through the second layer and into the first layer. The trench also extends through the further region, if it is present and extends a substantial length into the first layer. The trench thus defines a pedestal comprising a portion of the first and second layers and, if present, a portion of the further region. It is to be recognized that the trench can, in one embodiment, be annular in horizontal cross section. In an alternative embodiment, the trench can be comprised of a plurality of trench segments which when taken together, define the pedestal portion of the device. Thus, while in most applications that the trench will be continuous and will have a substantially rectangularized doughnut configuration, the trench can, alternatively include several discontinuities and be comprised of a plurality of segments.

The device also includes means associated with the first layer for diverting electric field lines associated with ionized impurities in the first layer from their conventional orientation which is in the direction of the on-state current flow and thus toward the second layer to a new orientation away from the second layer and toward the field diverting means and thus transverse to the direction of on-state current flow in the device to thereby increase the voltage supporting capability of the first layer and the breakdown potential of the device. The field diverting means can include an insulated gate structure disposed within the trench proximate a substantial portion of the first layer. The insulation layer of the insulated gate structure can comprise a native oxide, such as silicon dioxide, and the gate electrode can comprise a polysilicon, polysilicide or a high temperature refractory metal such as tungsten. During off-state and blocking operation, the insulated gate can be allowed to float, or advantageously can be biased with an appropriate potential selected to prevent the channel from conducting and yet also serve to divert the electric field established by the ionized impurities in the first layer, away from the second layer and, in a preferred embodiment, to couple with this electric field and thereby inhibit undesired electric field breakdowns and increase the blocking potential of the device. Such blocking potential is preferably closer to the second layer contact potential than to the first layer contact potential. In an insulated gate controlled device, the insulated gate structure used to divert the electric field within the first layer can be an integral extension of the control gate or alternatively can be separated therefrom. In a typical enhancement mode MOSFET, the field-diverting insulated gate can be connected to the source electrode in the off-state.

The gate insulation layer can be uniform over the entire depth of the trench or alternatively can be fabricated, in accordance with one aspect of the present invention, to have a first portion of thickness $T_1$ adjacent the first layer and second portion of thickness $T_2$ adjacent the second layer, the blocking junction and a portion of the first layer proximate the blocking junction wherein $T_2$ is less than or equal to $T_1$. The first and second portions of the insulation layer can be interconnected by a transition region comprising an oxide layer of gradually increasing oxide thickness. In an alternate embodiment, the insulation layer can comprise a graded layer which is thick proximate the leading, lower or bottom of the trench and thin proximate the surface of the device. It is also preferred that the thickness of the insulation on the trench bottom be greater than the thickness of the insulation on the sidewall of the trench. The bottom thickness can be increased, for instance, by damaging the bottom surface of the trench prior to oxidation to promote locally enhanced oxide growth using implanted oxygen, nitrogen or other non-doping species. The portion of the insulation layer proximate the second layer present can be eliminated or included to provide surface passivation when no further region is present. Similarly, the gate electrode need not be included adjacent the second layer when no further region is present, but can be provided as a process expedient.

A method of fabricating a device in accordance with the present invention comprises the steps of providing a body of semiconductor material such as a partially processed wafer comprising a first layer and establishing a second layer thereon. The second layer can be of one type conductivity and the first layer can be of opposite type conductivity. The second layer also can be of opposite type conductivity in a junction field effect transistor (JFET) or Schottky diode embodiment. In a junction diode embodiment the second layer can be of one type conductivity. In a MOSFET the second layer can comprise one type conductivity and can include a further semiconductor region.

After at least the second layer has been established on the first, a substantially vertical trench is etched through the second layer and a substantial length into the first layer to define a substantially vertical pedestal of semiconductor material. In a depletion mode MOSFET, an opposite type conductivity channel can be established between the further region and the first layer. An insulation layer is disposed within the trench on the pedestal and a gate electrode is disposed atop the insulation layer.

The present invention thus provides an improved vertical charge control insulated gate semiconductor device having improved conductivity. The disclosed vertical charge control insulated gate charge control device can be operated with increased current density. Moreover, these improvements are achieved without significant deterioration or negative impact on the vertical or anode-cathode breakdown voltage of the device.

BRIEF DESCRIPTION OF THE DRAWINGS

The features of the present invention which are believed to be novel are specified with particularity in the appended claims. The invention itself, however, both as to organization and method of operation together with additional objects, features and advantages of the improved conductivity vertical charge control insulated gate semiconductor device of the present invention can be best understood by reference to the following detailed description when considered in conjunction with the accompanying drawings in which:

FIG. 3D is a plot of the electric field of a typical vertical charge control device of the present invention of the sort exemplified in FIG. 3A;

FIG. 7A is an illustration of a top view of a preferred embodiment of a unit cell of a partially completed semiconductor device in accordance with the present invention;

FIG. 7B is an illustration of a top view of an alternate preferred embodiment of a unit cell of a partially completed semiconductor device of the present invention;

FIG. 7C is an illustration of a top view of a still further alternate preferred embodiment of a unit cell of a partially completed semiconductor device of the present invention;

FIG. 9 is a plot of carrier concentration against breakdown voltage for various pedestal widths in the device of the present invention.

DETAILED DESCRIPTION OF THE PREFERRED EMBODIMENTS

Figure 1:
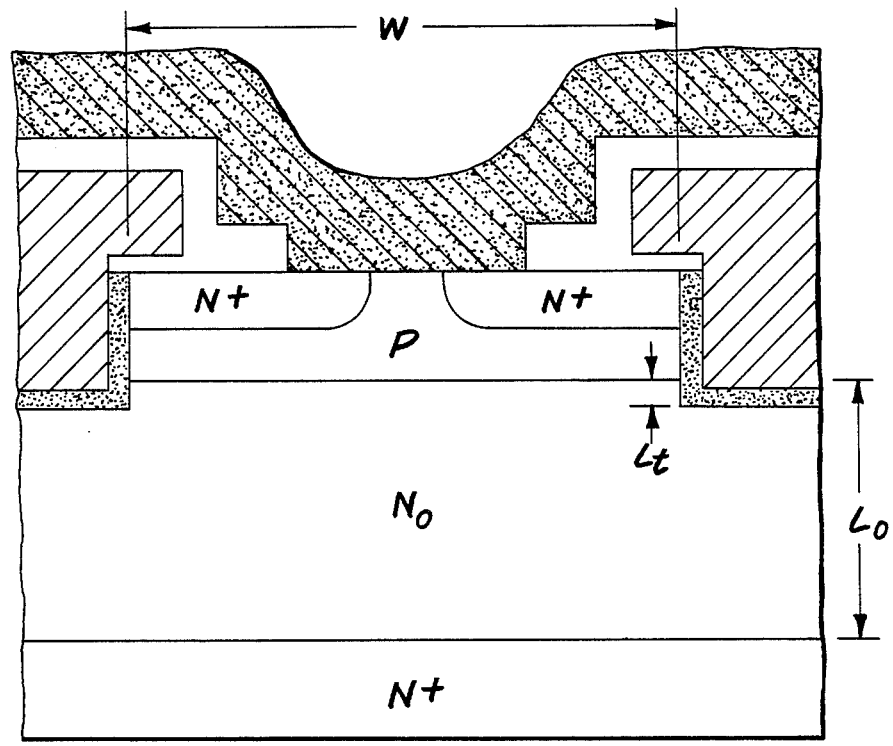
FIG. 1 is a cross-sectional illustration of a conventional vertical channel insulated gate device.

The vertical charge control insulated gate semiconductor structure of the present invention is applicable to a broad range of insulated-gate semiconductor devices and can be fabricated from a variety of different semiconductor materials. The ensuing description will disclose several preferred embodiments of the improved conductivity vertical charge control insulated gate device of the present invention implemented in a silicon substrate because silicon devices or devices fabricated in silicon substrates make up an overwhelming majority of the currently available semiconductor devices. Consequently, the most commonly encountered applications of the present invention will involve silicon substrate devices. Nevertheless it is intended that the invention disclosed herein can be advantageously employed in germanium, gallium arsenide and other semiconductor materials. Accordingly, application of the present invention is not intended to be limited to devices fabricated in silicon semiconductor material, but will encompass those devices fabricated in any of a number of semiconductor materials.

Moreover, while the present description discusses a number of preferred embodiments directed to silicon devices, it is intended that these disclosures be considered as illustrative examples of the preferred embodiments of the present invention and not as a limitation on the scope or applicability of the present invention. Further, while the illustrated examples concern the improved conductivity vertical charge control insulated gate structure of the present invention in connection with diodes and enhancement and depletion mode metal oxide semiconductor field effect transistors, it is not intended that the improved insulated gate structure be limited to these devices. These devices are included to demonstrate the utility and application of the present invention to what are considered the preferred commercial embodiments. Specifically, the present invention is additionally readily applicable to those insulated gate devices which are not required to support or block high reverse potentials, inasmuch as the present invention will allow the length of the drift region to be reduced. Further, while the present invention provides for improved current conductivity and current density, within the vertical device, it is also recognized that the attendant benefit of reduced cell size and reduced cell repeat distance resulting from the vertical channels will also result in improved cell density. Moreover, while certain equations have been presented in the description of the invention as an aid to understanding the operation of the present device, it should be understood that these equations apply to idealized examples and are intended to emphasize the operating principles of the present invention and should not be construed as a limitation on the scope or applicability of the present invention.

Given the corresponding relationship of FIGS. 2–7 corresponding parts have been designated with the same reference numeral as an aid to understanding the description of the present invention. Various parts of the semiconductor elements, however, have not been drawn to scale. Certain dimensions have been exaggerated in relation to other dimensions in order to present a clearer illustration and understanding of the invention.

Although for the purposes of illustration, the preferred embodiments of the improved conductivity vertical charge control insulated gate structure of the present invention are shown in each particular embodiment, to include specific P and N type regions, it is understood by those skilled in the art that the teachings herein are equally applicable to vertical charge control devices in which the conductivities of the various regions have been reversed to, for instance, provide the dual of the illustrated device.

Further, although the embodiments illustrated herein are shown in two-dimensional views with various regions of the device illustrated as having length and width, it is understood that these regions are illustrations of only a portion of a single cell of a device which is comprised of a plurality of cells arranged in a three-dimensional structure. Accordingly, these regions, when fabricated in actual devices, will have three dimensions, including length, width, and depth.

Figure 2A:
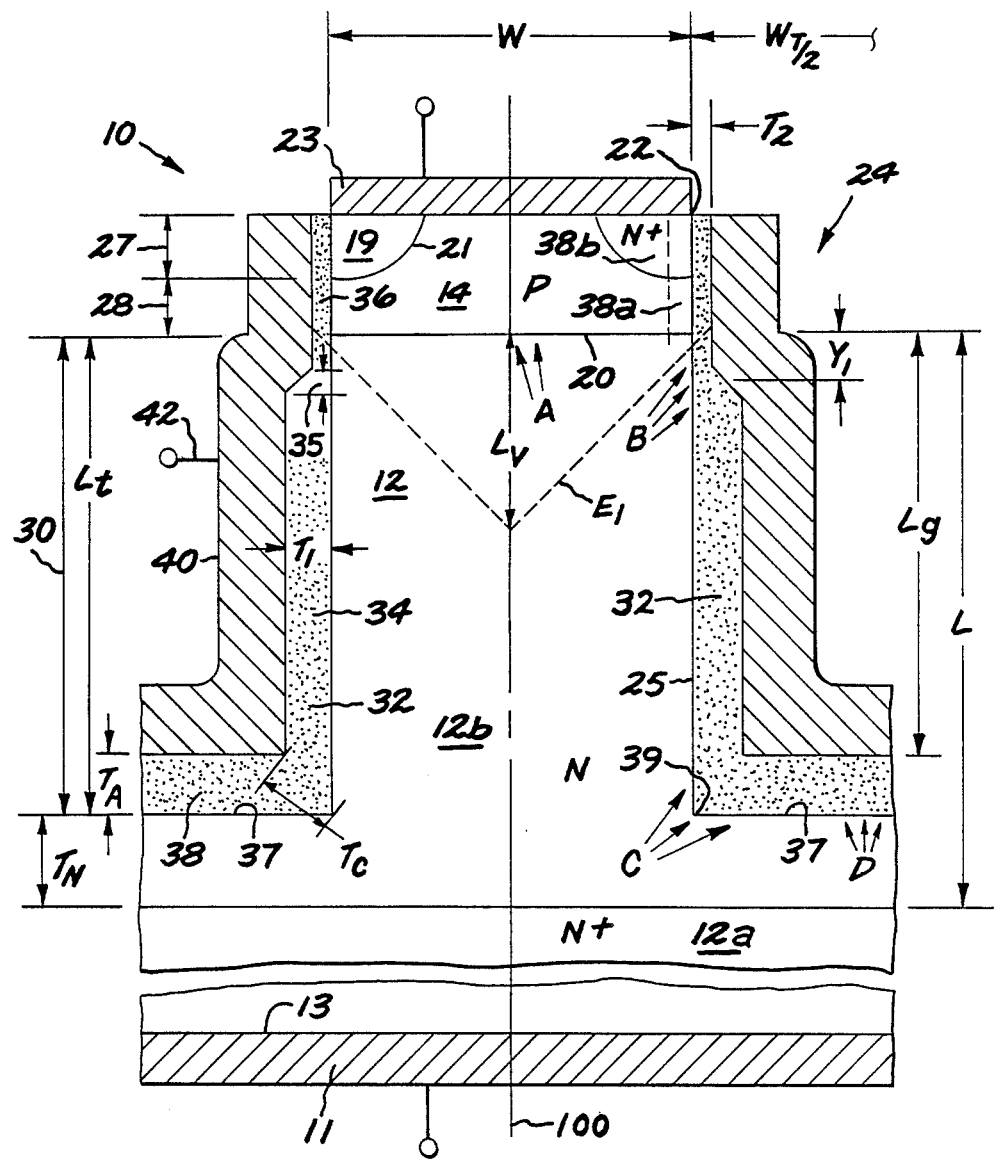
FIG. 2A is a cross-sectional illustration of a portion of a single cell of an improved conductivity vertical charge control insulated gate semiconductor structure in accordance with the present invention, such as might be used in the implementation of an enhancement mode metal oxide semiconductor field effect transistor.

Referring now to FIG. 2A, a preferred embodiment of the present invention as applied to a portion of a single cell of a metal oxide semiconductor field effect transistor which is symmetric about a vertical axis through the central portion of the device, is shown. The improved conductivity vertical charge control insulated gate device structure in accordance with the present invention and generally designated 10, is shown to comprise a partially processed wafer comprising a first layer 12 which is shown as an N type conductivity layer. The first layer 12 can include a heavily doped lower portion 12a shown as an N+ layer and a less heavily doped upper portion 12b shown as an N layer. The heavily doped portion facilitates the establishment of ohmic contact, and the precise structure and benefits associated with the doping profile of the upper portion 12b of the first layer 12 will be discussed below in connection with FIGS. 3A–3C. A contact pad 11, such as an anode electrode metal contact pad, is disposed on and in ohmic contact with, a lower surface 13 of the first layer 12.

A second layer 14 of one type conductivity, illustrated as a P-type layer, is disposed atop the first layer 12 which is of opposite type conductivity. A further opposite type conductivity region 19, illustrated as an N-type conductivity source region, is disposed within the second layer 14. A first PN reverse blocking junction 20 is formed between the second layer 14 of one type conductivity and the first layer 12 of opposite type conductivity. A second junction 21 is formed between the source region 19 and the second layer 14. A portion of the second layer 14 and a portion of the source region 19 form an upper surface 22 of the device. An electrode, such as source electrode 23, is disposed on, and in ohmic electrical contact with the second layer 14 and the source region 19, and shorts the PN junction 21 disposed therebetween. Since the device is three dimensional, a better understanding of the present invention can be achieved by assuming the disclosed vertical cross section can be rotated 90° about the axis 100 without changing the view of FIG. 2A whereby it would have a plan view like that in FIG. 7E.

A trench 24 in the semiconductor material extends through the source region 19, through the second layer 14 and into the first layer 12 and a trench sidewall 25 is thus provided to define a pedestal portion of the device. An insulation layer 32 is disposed on the sidewall 25 of the trench 24. A gate electrode 40 is disposed atop the insulation layer 32. The gate electrode 40 couples to the electric field originating with the ionized impurities of the first layer 12 portion of the pedestal. The gate electrode 40, by coupling to the electric field associated with the ionized impurities, reorients the electric field and enables the device to exhibit a unique operating characteristic.

It is to be recognized that various alterations in the basic structure of the vertical charge control device of the present invention can be made to achieve a particularly improved device. In particular, the doping concentration of the pedestal portion of the drift region 12 can be increased beyond $N_o$, the maximum doping concentration of a conventional device, provided the width of the pedestal is less than $4V_B/E_{AV}$. Alternatively, the length of the drift region 12 can be reduced to be a factor of 2 less than the length of a conventional drift region. The ensuing disclosure will more closely consider each of the structural features of the present invention and the benefit thereby conferred.

Superimposed on FIG. 2A is a construction which represents an equal potential line $E_1$ which is located an approximately equal distance from the second layer 14 depletion region of the first junction 20 and the charge control electrode 40. $L_v$ is shown to illustrate the maximum length to which this region extends into the first layer 12. $L_v$ is measured from the midpoint of the depletion region of junction 20. Within this region, the electric field lines are primarily vertical and device operation within this region of the pedestal can be characterized by equations (1)–(3). The region outside the equal potential line can be influenced by the charge control electrode 40 and consequently, device operation outside this region of the pedestal can be characterized by equations (4)–(6).

Proper control of the electric field associated with the ionized impurities of the first layer 12 is critical to the present invention. Electric field breakdown in a vertical pedestal has been found to occur where the electric field is the greatest. Four specific breakdown areas of the device which are susceptible to electric field breakdown have been identified with the letters A, B, C and D in FIG. 2A as follows:

A. Across the blocking junction 20 between the first and second layers 12 and 14, respectively near the center of the cell 10. Breakdown can occur at this location if the carrier concentration within the first layer 12 is too large or if the width W of the device is too large, so that the charge control gate electrode 40 does not couple to a sufficient portion of the electric field in the first layer and the P-N junction 20 breaks down. In particular, the device should be constructed to ensure that $L_v N_q$ is less than $\epsilon E_{AV}$ to avoid breakdown, where $L_V$ is the depth to which conventional breakdown characteristics extend over the drift region and N is the doping concentration within the first layer, $E_{AV}$ is the avalanche breakdown potential, q is charge and $\epsilon$ is permittivity.

B. Breakdown can occur in the path along the sidewall 25 if the oxide thickness $T_2$ is too thin and if the $T_2$ to $T_1$ transition occurs too far below the blocking junction 20 or if the transition is too large or abrupt.

C. Breakdown can occur at the side corners of vertical trench 24. The electric field through the corner is necessarily locally high and an adequate insulation layer must be provided to prevent breakdown.

D. Breakdown can occur in a path shorting the gate 40 at the bottom 37 of the trench 24 to the first layer 12 if the oxide thickness is too thin or if the carrier concentration in the portion of the first layer 12 beneath the trench is too high. This is normally not a controlling factor.

Thus, having considered the theoretical and functional characteristics of the vertical charge controlled device of the present invention, the ensuing portion of the detailed description will identify the various structural features of the device of the present invention and discuss the contribution each makes to improving the operating performance of the device.

Vertical trench 24 exposes not only sidewall 25 of the device pedestal, but also sidewall portions 27, 28 and 30 of the source region and second and first layers 19, 14 and 12, respectively. The meaning of the term substantially vertical trench 24 will be explained in more detail in connection with FIGS. 2B and 2C. For the present discussion, it is sufficient to understand that the trench 24 illustrated in FIG. 2A is one version of a substantially vertical trench. The length of the trench 24 and the depth to which it extends into the first layer 12 can be affected by available process techniques and doping profile of the first layer portion of the pedestal, the latter being discussed in more detail in connection with FIG. 3 below. In a first preferred embodiment illustrated in FIG. 2A, a uniform doping profile is provided throughout the first layer 12, the trench 24 extends through greater than 50% of the first layer 12 and a length $L_t$ into the first layer measured between the blocking junction 20 and the leading edge or bottom of the trench. The vertical trench 24 in one embodiment has a substantially rectangular vertical cross-section, and a circular lateral cross-section, a top view of which may be shown by FIG. 7E below. The pedestal is illustrated to have a width W. In contrast to conventional devices in which the ratio of $L_t/W$ approaches zero, it is preferred, in the device of the present invention, that the ratio of $L_t/W$ be greater than 0.5 and preferably be greater than or equal to 1.

A single trench 24 through a given semiconductor body can essentially split that given semiconductor body into a plurality of separate cells wherein the portion of the semiconductor body situated between the adjacent trenches or portions thereof is, by definition, the vertical pedestal portion of a cell of the device 10. The pedestal of FIG. 2A can be considered to be partially surrounded by a single trench 24 or alternatively the pedestal can be considered to be bounded at least in part, on the opposite sides by separate trenches 24 which can advantageously be disposed symmetrically about the axis of the pedestal. A top view of such alternate embodiments is shown in FIGS. 7B and 7C discussed below.

It will be recognized by those skilled in the art that a trench 24 need not be employed, but instead, a gate electrode 40 and insulation 32 can be disposed adjacent an uncut first layer 12. However, a trench construction is preferred inasmuch as trench-type construction allows for the maximum use of device real estate. More particularly, a plurality of trenches 24 can be established in a semiconductor wafer in close proximity to each other to define a plurality of cells in closely-spaced relation to thus obtain maximum use of the available device real estate.

The first sidewall portion 30 of the trench 24 encompasses a substantial portion of the first layer 12 comprising the voltage supporting blocking or drift region of the device 10, to maximize the surface area of the first layer 12 which lies adjacent the charge control gate electrode 40 and hence the surface area of the first layer 12, subjected to vertical charge control in accordance with the present invention. Further, the exposed surface area of the first layer 12 can be increased by reducing the cell or pedestal width W and increasing the number of cells per unit area. The second sidewall portion 28 and the source portion 27 of the sidewall 25 are provided in MOS controlled devices to establish insulated gate control of the device.

The insulation layer 32 is shown to be comprised of first and second portions 34 and 36 respectively, adjacent the first and second layers 12 and 14, respectively and having thicknesses $T_1$ and $T_2$, respectively, wherein $T_1$ is greater than $T_2$. The insulation layer 32 can alternatively have a single uniform thickness, or be comprised of a plurality of regions having thicknesses $T_A$, $T_B \ldots T_Z$ where $T_A$ is greater than $T_B \ldots$ which is greater than $T_Z$ and the thicker portion, $T_A$, of the insulation layer 32 lies adjacent the first layer 12 and the thinner portion $T_Z$ of the insulation layer 32 lies adjacent the second layer 14.

A transition region 35 between the first and second portions 34 and 36, respectively of the insulating layer 32 can be made as either an abrupt interface or a graded interface. It is preferred in the practice of the present invention, that the transition region 35 between the adjacent portions of the insulation layer 32 be established as a non-abrupt interface and preferably as a graded interface to avoid radical transitions in the electric field which might otherwise contribute to reducing the breakdown voltage of the device.

The degree to which a smooth transition between the portions of the insulation layer 32 can be achieved is in large part dependent on the available processing techniques. It has been found that a non-abrupt transition region 35 can be achieved by forming the trench 24 in two or more successive steps which are not illustrated in FIG. 2A. In the first step, the trench 24 is etched through the further region 19, if it is present, and the second layer 14, and partially into the first layer 12, by a wet etch or a reactive ion etch. Thereafter, a thin gate oxide having a thickness $T_2$ can be grown on the exposed portions 27 and 28 of sidewall 25 to form the thin second portion 36 of the insulation layer 32 adjacent the further region 19 if it is present, the second layer 14 and a small portion of the first layer 12. A nitride layer (not shown) can be deposited atop the thin oxide layer 36 to prevent further oxidation of the sidewall portions 27 and 28. Thereafter, the excess nitride can be removed from the bottom of the trench by, for instance, a reactive ion etch to leave a thin nitride-over-oxide coating covering the sidewall portions 27 and 28 to form a sidewall spacer. In a second step, the trench 24 can be extended into the first layer 12 to a desired length by employing a directional etch such as a reactive ion etch which attacks silicon, but which will not attack the sidewall nitride to any great extent. Subsequently, the newly-exposed portion 30 of the trench sidewall 25 can be oxidized to form a thick first portion 34 of insulation layer 32. The previously-deposited nitride layer can then be removed by an etch directed specifically at nitride materials. In this example, the insulation layer 32 is formed with a thick first portion 34 and a thinner second portion 36.

It should be recognized that the insulation layer 32 can be made to exhibit a smooth transition from a thin oxide to a thick oxide by dividing the total length $L_t$ of the trench 24 into a large number of segments and successively performing the first step on arbitrarily small portions of the trench 24 wherein each segment is etched and oxidized and then the exposed oxide is covered with a nitride cap to form another sidewall spacer segment. Subsequently, the next trench segment can be etched. More details of this process can be obtained by reference to the above-identified copending application. The investigations performed to date indicate that while improvements can be expected from insulation layers exhibiting a gradually increasing thickness, an insulation layer 32 comprising two separate layers 34 and 36 with a non-abrupt transition region 35 therebetween is satisfactory for most commercial devices. In particular, in typical 100 volt breakdown voltage devices, a smooth insulation layer transition allows the carrier concentration in the first layer 12 to be increased from 1.1 to 1.45 E16 carriers/cm$^3$, to thereby improve the on-conductance of the device.

The shape and thickness of the corner portion 39 of the insulation layer 32 also affects the breakdown voltage of the device. Inasmuch as a high concentration of the electric field passes through the trench corner, it is desirable that the corner portion 39 of the insulation layer 32 be as thick as possible. A typical thickness $T_C$ of the corner portion of the oxide is between 10,000 and 14,000 angstroms for 100 to 200 volt device breakdown. It is also preferred that the inside corners of the trench 24 would be smoothly rounded with as large a radius of curvature as possible. An improved radius of curvature can be obtained by first oxidizing the corner surfaces and then removing the oxide to leave an expanded and rounded corner. The electric field profile associated with the corner is then less abrupt. A rounded corner can employ a uniform corner oxide to provide the same breakdown voltage in a given structure.

The trench 24 also includes a bottom surface which has been illustrated as a substantially flat surface 37. A third portion 38 of the insulating layer 32 is shown covering the bottom of the trench 24. The third portion 38 of the insulating layer 32 has a thickness $T_B$ which can be greater than the thickness $T_2$ of the second portion 36 of the insulating layer 32 and approximately equal to or greater than the thickness $T_1$ of the first portion 34 of the insulating layer 32. A thicker third portion 38 of the insulating layer 32 can be grown by, for instance, damaging the bottom surface of the trench 24 to cause an oxide to grow faster on the damaged surface.

The thickness of the insulation layer 32 is of importance. The thickness $T_2$ of the second portion 36 of the insulation layer 32 is directly related to the magnitude of voltage which must be applied to the gate electrode 40 to establish a gate-induced channel in semiconductor layer 14. The thicknesses $T_1$ and $T_B$ of the first and bottom portions 34 and 38, respectively of the insulating layer 32 are related to the isolation capability of the insulating layer 32. Thick portions 34 and 38 allow a large voltage to be applied to the gate electrode 40 to enable the gate electrode 40 to reorient an electric field of greater magnitude and thus allow the first layer 12 of the vertical pedestal of the device to be doped to a higher doping concentration, to thereby improve the conductivity or conversely lower the resistivity of the first layer 12.

The on-resistance of the pedestal portion of the first layer 12 of the device 10 is proportional to the thickness T of the insulation layer 32 disposed on the sidewalls of the trench. It is desirable to minimize the thickness T of the insulation layer 32 to minimize the on-resistance. With a thinner insulation layer 32, a more conductive accumulation layer is also established which lowers the resistance of the first layer to some degree. At the same time maintaining the thickness above a minimum thickness required to avoid electric field breakdown across the corner and sidewall portions of the insulation layer 32 of the device 10. In a typical 100 volt device, T can be chosen as follows:

| Region | Thickness | Typical Values |
|---|---|---|
| I. Uniform Thickness | | |
| insulation layer 32 | T | 1,500–2,000 angstroms |
| II. Segmented Insulation | | |
| second portion 36 | $T_2$ | 100–1,500 angstroms |
| first portion 34 | $T_1$ | 1,500–10,000 angstroms |
| third portion 38 | $T_B$ | 1,500–10,000 angstroms |
| corner portion 39 | $T_C$ | 1,500–15,000 angstroms |

It has thus been determined that the insulation layer thicknesses $T_1$, $T_2$, $T_B$ and $T_C$ although not entirely decoupled from other device parameters, are independent of the device geometry within reasonable limits. Thus device geometry and doping level of the various regions can be established based on other considerations such as the on-conductance and fabrication requirements. In general, oxide thicknesses and channel dimensions should be selected to provide the highest breakdown voltage and the highest carrier concentration to thereby maximize the on-state performance of the resulting device.

The placement of the insulation transition region 35 relative to the blocking junction 20 is also of importance. The transition region 35 should be positioned adjacent the first layer 14 and should be separated from the blocking junction 20 by a distance $Y_1$. At a minimum, $Y_1$ should be 0.1 microns. The vertical distance $Y_1$ is measured from the blocking junction 20 to the center of the insulation transition region 35. Increasing the distance $Y_1$ serves to improve the effectiveness of the vertical charge control achieved by the gate electrode near the blocking junction 20 and thus contributes to a modest improvement in the breakdown voltage. More specific details of the effect on the device electric field occasioned by variations in the thickness $T_1$ of the first portion 34 of the insulation layer 32 and the separation $Y_1$ from the junction are analyzed in connection with FIGS. 8C, 8D and 8E discussed below.

As previously discussed, a gate electrode 40 is provided atop the insulation layer 32 and within the trench 24. While the illustrated embodiment shows the gate electrode 40 to have a substantially uniform thickness which conforms to the irregular surface of the insulation layer 32, this figure is provided for the purposes of illustration; and more typically, the gate electrode 40 will fill the trench 24 between adjacent pedestals. The gate electrode material can comprise a polysilicon which preferably is doped to an appropriate conductivity with one type or opposite type carriers. The gate electrode material can alternatively comprise a polysilicide, or a refractory metal such as tungsten. Further, although the gate electrode 40 is shown as being continuous and extending over both the first and second portions 34 and 36 of the insulation layer 32, it is within the scope of this invention to provide separate gate electrodes (not shown) over the first and second portions 34 and 36 of the insulation layer 32 to permit the gate electrodes to be separately controllable. Inasmuch as it is desirable to couple to as much of the electric field as possible originating with the ionized carriers of the first layer, it is preferred that the gate electrode 40 be substantially continuous over the first, second and third portions 34, 36 and 38 of the insulation layer 32 and biased to an appropriate potential. It is also recognized that various stratified structures comprising alternate layers of insulation and gate material can be established within the trench 24. Even though the gate electrode material of a particular layer extends over only a small portion of the first layer, the gate electrode 40 comprising the gate material of all layers is preferably substantially continuous over sidewall portion 30 adjoining the first layer 12.

The gate electrode 40 extends to a depth $L_g$ within the trench 24. Inasmuch as the lower edge of the gate electrode 40 is separated from the lower edge of the trench 24 by the thickness of the third portion 38 of the insulation layer 32, the length $L_g$ of the gate electrode closely approaches the length $L_t$ of the trench. In actual embodiments, the thickness of the third portion 38 of the insulation layer 32 is preferably greater than 1,000 angstroms and commonly in the order of 1,500–10,000 angstroms. Because of the narrow thickness of third portion 38 of insulation layer 32, the length $L_t$ of the trench is approximately equal to the length $L_g$ of the gate. Thus, the trench aspect ratio $L_t/W$ is closely tied to the electrode aspect ratio $L_g/W$ wherein the ratio of length of the gate electrode $L_g$ to the width W of the pedestal is also greater than or equal to 0.5 and preferably greater than or equal to 1.

While the gate electrode 40 need not extend the full depth of the trench 24, it is preferred that the gate electrode fill the entire depth of the trench 24 which is not otherwise occupied by, for instance, the insulation layer 32 to thus provide a maximum degree of charge control adjacent the first layer 12.

Thus, in the device of the present invention, the breakdown voltage of the pedestal portion of the first layer 12 disposed between the gate electrode 40 can be reduced by the presence of the gate 40 whether or not the gate electrode is biased. If the gate electrode is unbiased, the gate electrode will float to a potential approximately halfway between the source and drain potentials, and thus even a floating gate electrode 40 makes a substantial contribution to improving the on-resistance of the device. An even greater improvement in device breakdown voltage can be achieved by biasing the gate electrode to an appropriate potential. In the off-state, it is preferred that the gate bias be closer to the source potential than the drain potential. Typically, in a MOSFET embodiment, this gate potential can be obtained from the source electrodes of the device 10. Thus, in a preferred embodiment, the device 10 can also include a means for coupling the gate electrode 40 to an off-state bias potential of a magnitude and polarity sufficient to couple and redirect the electric field associated with the ionized impurities in the first layer 12. One example of a means for coupling the gate electrode to an off-state bias potential is illustrated as a terminal 42, which can be coupled to a source of bias potential.

In the illustrated enhancement mode device embodiment, on-state operation is achieved when a bias means, not shown, supplies a minimum potential to the gate electrode 40 to thereby cause the gate electrode 40 to establish a channel comprising an inversion layer within at least the second layer 14. In the illustrated example, the application of a bias of one type polarity to the gate electrode 40 establishes an inversion layer 38a or channel, of opposite type polarity, shown within the second layer 14 of one type conductivity and an accumulation layer 38b of opposite type conductivity within the opposite type conductivity first layer 12 and source region 19. In combination, the inversion layer 38a and the accumulation layer 38b establish a channel for the conduction of opposite type conductivity carriers between the first layer 12 and the source region 19 and to the first electrode 23.

Thus, in a preferred embodiment of the present invention, the carrier concentration in the first layer 12 or voltage supporting region of the present invention can thus be several orders of magnitude larger than the carrier concentration in conventional devices. By virtue of the insulated gate charge control electrode 40 of the present invention extending deep within the first layer 12, the device can be more heavily doped and can sustain a larger breakdown voltage than the breakdown voltage sustained in conventional vertical channel devices. In conventional devices, the maximum doping concentration within the drift layer is limited by the avalanche electric field potential as indicated by equation (3) above. In a device of the present invention, the carrier concentration within the first layer portion of the pedestal can be increased above the maximum doping concentration of a conventional device as specified in equation (6) above.

Another characteristic of the present invention is that the product of the width of the pedestal and carrier concentration within the voltage supporting region be approximately constant. As indicated in FIG. 9 below, the product of WN is approximately equal to $3 \times 10^{17}$ atoms microns/cm$^3$. As the pedestal width increases, the carrier concentration must decrease to enable the charge control electrode 40 to control the electric field associated with the ionized carriers within the voltage supporting region. In most embodiments, the width of the pedestal is preferably less than or equal to a maximum of $4V/E_{AV}$. However, as W decreases, N is allowed to increase, which is advantageous since the charge control electrode 40 is better able to control the electric field within a narrow pedestal.

Other improvements also result from the increased carrier concentration within the first layer 12. The spreading resistance within the pedestal portion of the first layer 12 is reduced by virtue of the increased doping concentration within that region. Consequently, carriers flowing within the pedestal portion of the first layer 12 are substantially uniformly distributed. Thus, a substantially uniform current flows out from the pedestal portion of the first layer 12 into the remainder of the first layer 12. The improved spreading resistance also helps to reduce peak fields to allow the device to exhibit a high breakdown voltage.

Breakdown voltage is another important device operating parameter. As can be seen from equation (5) above, the breakdown voltage of the improved charge control device has been rendered substantially independent of the carrier concentration within the first layer 12 or voltage supporting region, and instead is directly proportional to the length L of the upper portion 12b of the first layer 12 blocking region. Thus, the present invention provides for the fabrication of thinner devices or devices in which the length L of the upper portion 12 is reduced, and in a preferred embodiment, is less than 12.5 microns, but which devices exhibit breakdown potentials equivalent to the breakdown potentials of conventional devices. Alternately, devices of approximately the same thickness as conventional devices can be fabricated to exhibit higher breakdown voltage and lower on-resistance than conventional devices.

The thickness $T_N$ of the portion of first layer 12 beneath the trench 14 also affects the breakdown voltage of the device. It has been found that, for maximum breakdown voltage, portions of the first layer 12 beneath the trench 24 should have an optimal thickness approximately equal to at least one-half the width W of the pedestal.

Thus, it has been determined that an improved conductivity vertical charge control device can be achieved by first establishing an appropriate aspect ratio $L_t/W$ for the device by selecting the width W of the vertical pedestal 10 and establishing the length, $L_t$ of the trench. Appropriate thicknesses for the first, second and third portions 34, 36 and 38, respectively of the insulating layer 32 can then be selected. Further, a general guideline can be established that once the thickness $T_1$ of the first portion 34 sidewall oxide 32 is chosen, the width $W_T$ of the trench should be approximately at least $2T_1+0.5$ micron to allow for the inclusion of a gate electrode 40 within the trench 24.

From the foregoing, it can be seen that as different device parameters are selected, devices with different operating characteristics result.

A method of fabricating a device in accordance with the present invention comprises initially providing a partially processed semiconductor wafer which, in a preferred embodiment, comprises a moderately doped first layer 12. A second layer 14 of one or the opposite type conductivity is established atop the opposite type conductivity first layer 12 by, for instance, epitaxial growth, or doping techniques such as diffusion or implantation.

Thereafter, a first protective layer is established atop the second layer 14. The first protective layer can be established by, for instance, growing an oxide layer and then subsequently establishing a nitride layer atop the oxide layer. In addition, a temporary protective layer such as a thick oxide can be applied atop the first protective layer to protect the device surface during the ensuing trench etch. Photolithographic techniques can be employed in combination with an external mask of a desired configuration to open a first window through the temporary protective layer and first protective layer to expose a first portion of the surface of the second layer 14.

Thereafter, in one embodiment, the second layer 14 can be doped with opposite type conductivity dopant to establish an opposite type conductivity first region 19 within a second layer 14 of the one type conductivity. It is preferred that the first region 19 extend beneath the first protective layer. In a preferred embodiment, opposite type conductivity dopants such as phosphorous impurities can be introduced by conventional diffusion or implantation techniques to establish the first region 19.

By using the previously established first window, a trench is also established through the first region 19, if it is present, through the second layer 14 and into a portion of the first layer 12 of the partially processed semiconductor wafer. The length to which the trench extends into the first layer may vary. In a particularly preferred minimum on-resistance embodiment, the trench extends substantially into the wafer such that the ratio of the trench length $L_t$ to the width W of the pedestal is equal to or greater than 0.5. The trench can be established by employing a directional etch, such as a wet etch in the 110 direction in a silicon semiconductor. material, or by employing a reactive ion etch or directional drive etch. Thereafter, an insulating layer 32 is formed on the exposed surfaces of the trench by, for instance, exposing the trench surfaces at an elevated temperature to an oxygen atmosphere. The trench is then refilled with a gate electrode material which preferably can be oxidized and replanarized. Gate materials meeting these criteria include polysilicons, polysilicides and refractory or high temperature metals such as tungsten. After the gate material has been established within the trench, the gate material is patterned to provide a contact area and is replanarized to expose the first protective layer. A second protective layer is grown over the gate electrode material and the first protective layer is then removed from the device. Thereafter, a device metallization layer is applied and patterned to provide external contacts connected to various device regions. Further, the metallization layer can be employed to interconnect the regions of a plurality of device cells disposed within a semiconductor substrate. A contact window can be opened through the second protective layer and a gate metallization can be applied through the contact window.

It is to be understood that the above-described method is an illustrative example of a method that can be employed in the fabrication of a device in accordance with the present invention. Modifications to this method can be made as required to achieve a desired device. Some of these modifications are discussed in more detail in connection with FIGS. 3–7 below and more detail of the basic method can be obtained from the above-referenced copending application.

Figure 2B:
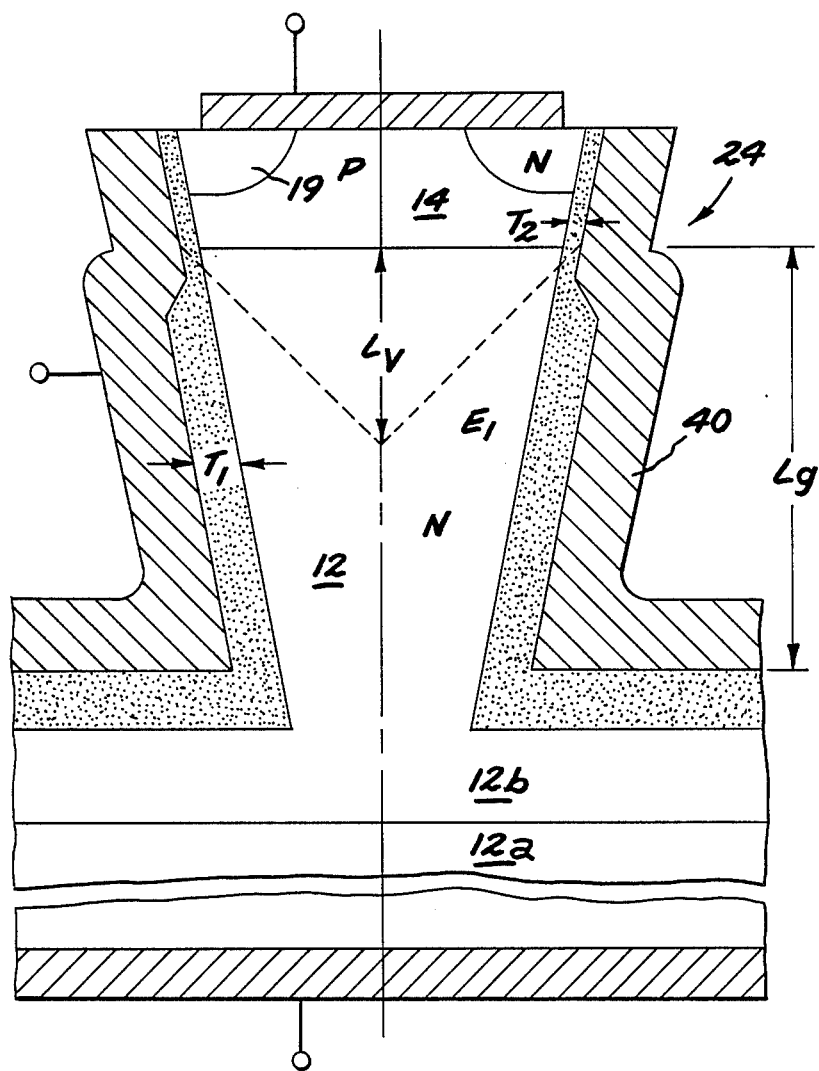
FIGS. 2B and 2C are illustrations of alternate preferred embodiments of the present invention which employ substantially vertical trenches.
Figure 2C:
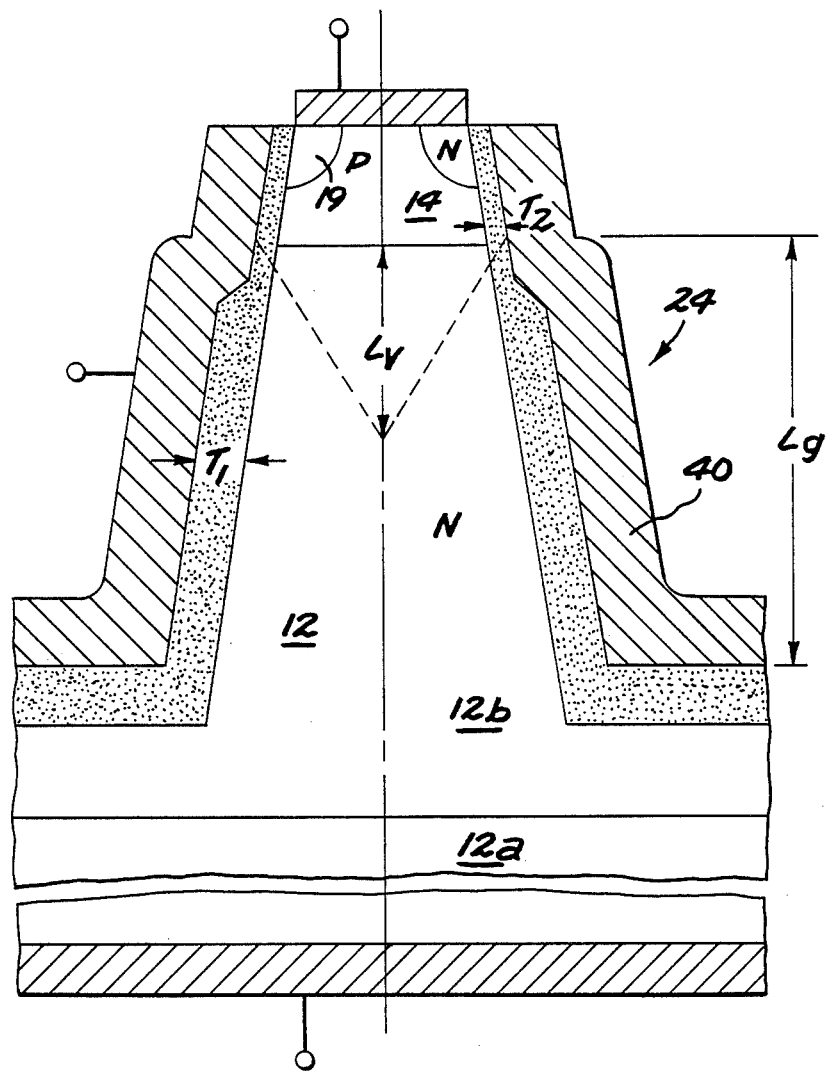

By referring now to FIGS. 2B and 2C in combination with FIG. 2A, a more detailed understanding of the meaning of the term "substantially vertical trench" can be obtained. As shown in FIG. 2B, the trench 24 can be cut on a bias such that the width of the second layer 14 is greater than the width of the first layer 12. It should be noted that the conventional breakdown region defined by the equipotential lines falls within the pedestal, that the distance $L_v$, the conventional breakdown distance, is less than $L_g$, the vertical length of the gate electrode 40.

In FIG. 2C, the trench 24 is also cut on a bias but in this embodiment, the width of the first layer 12 is greater than the width of the second layer 14. Again, the conventional breakdown region, which is within the equipotential lines, falls well within the pedestal and the distance $L_v$ is less than $L_g$.

Thus, in the context of FIGS. 2A, 2B and 2C, the term "substantially vertical trench" 24 encompasses those trenches which are cut on a bias but which establish a pedestal in which $L_v$ is less than $L_g$. If $L_v$ is greater than $L_g$, vertical charge control is lost and conventional break-down considerations will govern.

Figure 3A:
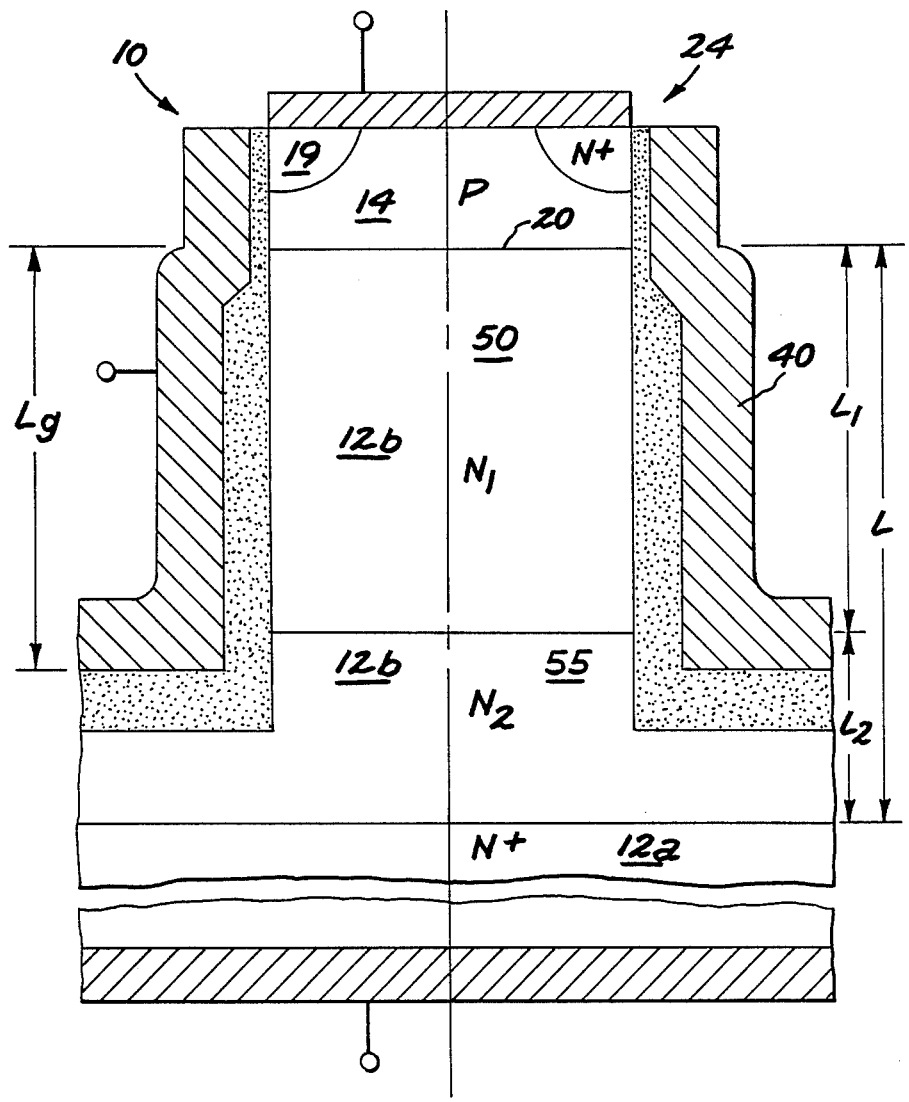
FIGS. 3A, 3B and 3C are illustrations of alternate preferred embodiments of a device in accordance with the present invention in which the doping profile of the first layer has been specially structured to improve the breakdown potential of the device.
Figure 3B:
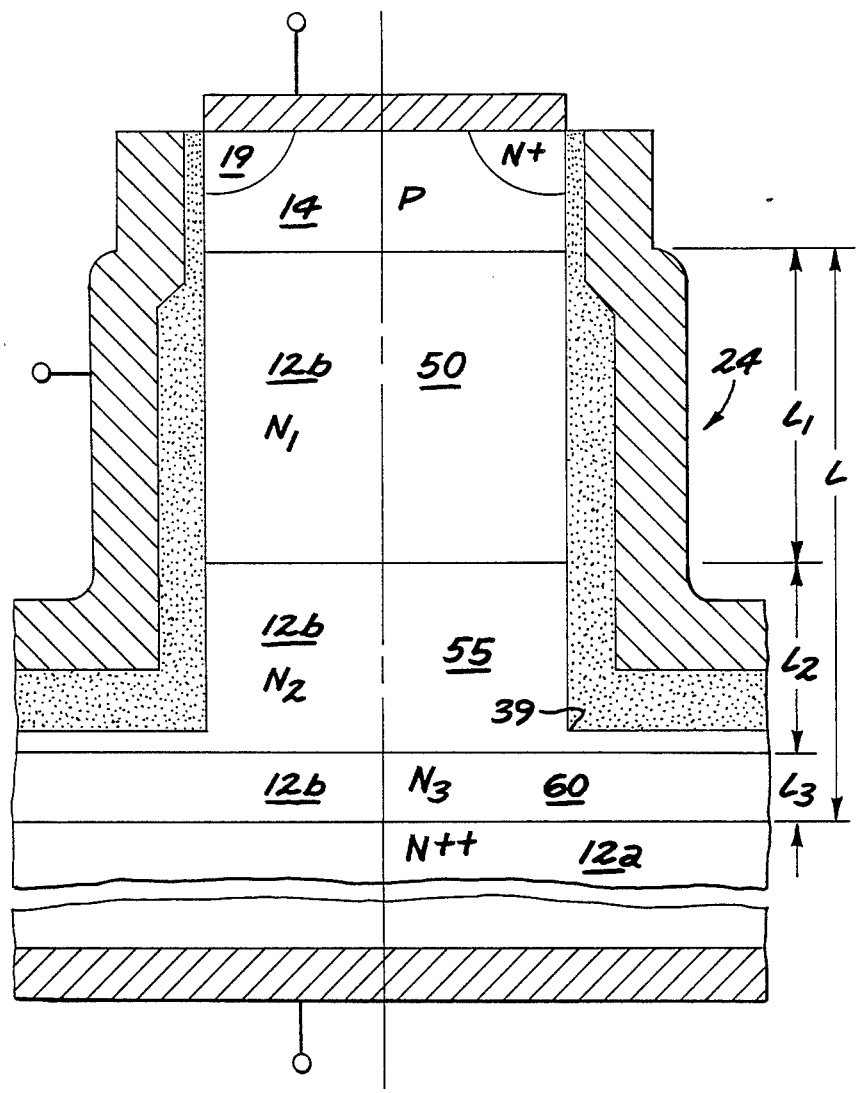
Figure 3C:
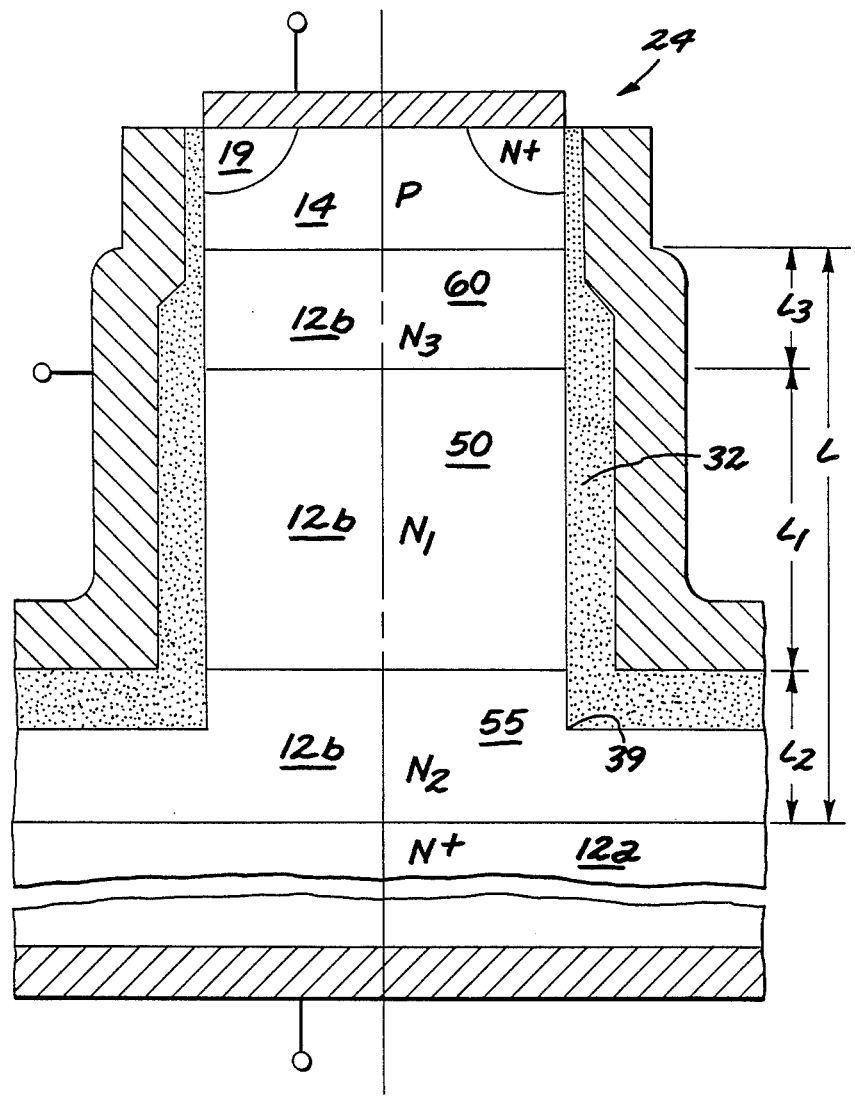

Referring now to FIGS. 3A, 3B and 3C, alternate embodiments of the device 10 are shown wherein the upper portion 12b of the first layer 12 comprises two or more separate zones of the same type conductivity semiconductor material but doped to different concentration levels. More particularly, as shown in FIG. 3A, the first layer 12 can comprise a first zone 50, having a doping concentration $N_1$ and being disposed entirely within the pedestal and between the gate electrode or electrodes 40. A second zone 55, having a doping concentration $N_2$, is disposed within a portion of the pedestal and also extends beneath the trench 24. It is preferred that the doping concentration $N_2$ of the second zone 55 be less than the doping concentration $N_1$ of the first zone 50. Thus, first zone 50 within the pedestal exhibits low on-resistance and high voltage supporting capability under reverse bias conditions. The second zone 55 supports the gradual reduction of the electric field from its high level at the blocking junction 20 to a near zero level at the interface with the heavily doped lower portion 12a of the first layer 12.

The structure of FIG. 3A also contributes significantly to the reduction of the electric field at the corners of the trench 24. As discussed previously, the trench corners are a primary breakdown location inasmuch as a high field flux flows through the corner. The present embodiment reduces the concentration of ionized impurities proximate the corner and thus reduces the electric field incident on the corner. Thus, the trench corner is subjected to a reduced breakdown exposure by virtue of the dual zone upper portion 12b of the first layer 12 of FIG. 3A. The embodiment also helps resist breakdowns between the substrate and the trench bottom at location D.

In the embodiment of FIG. 3A, it is preferred that the $N_1$–$N_2$ boundary be close to the lower edge of the gate electrode to minimize the device on-resistance. In an example discussed in conjunction with FIG. 3D, the length of the first zone 50 is approximately ⅔ L and the length of the second zone 55 is L/3 where L is the total length of the upper portion 12b of the first layer 12. Thus, the device of FIG. 3A supports a small amount of reverse voltage over the second zone 55 and supports the major amount of reverse voltage over the first zone 50 disposed within the pedestal.

In an alternate preferred embodiment of the device of FIG. 3A, the upper portion 12b of the first layer 12 of the present invention comprises the first and second zones 50 and 55, respectively, each have a length approximately equal to L/2 where L is the length of the entire first layer 12. In this embodiment, the second zone 55, in addition to reducing fringing fields at the trench corners, contributes significantly to supporting voltage during reverse bias operation of the device. This embodiment can be used to overcome corner problems and also extend the breakdown voltage of the device when the trench 24 cannot be extended.

Another preferred embodiment, the first zone 50 exhibits a doping concentration of $N_1$ and a length $L_1$. The second zone exhibits a doping concentration of $N_2$ and a length $L_2$ while the first layer exhibits a length L. It is preferred that the sum of $N_1L_1$ and $N_2L_2$ divided by L be less than $\epsilon E_{AV}^2/2qV$ which represent the maximum doping concentration that can be achieved in a non-charge control structure.

In the device of FIG. 3B the upper portion 12b of the first layer 12 comprises three zones of material. The first zone 50 disposed within the pedestal is heavily doped to a concentration $N_1$. A second zone 55 can be lightly doped to a concentration $N_2$ and is disposed beneath the first zone 50 and adjacent the corner 39 of the trench 24. The third zone 60, moderately doped to a concentration $N_3$, extends outside the pedestal and beneath the trench 24. The lengths of the first, second and third zones are $L_1$, $L_2$, $L_3$, respectively, and the length of the entire first layer 12 is L. It is preferred that the sum of $N_1L_1$, $N_2L_2$ and $N_3L_3$ divided by L be greater than $\epsilon E_{AV}^2/2qV$.

In the device of FIG. 3C, the upper portion 12b of the first layer 12 is comprised of a first zone 50, a second zone 55 and a third zone 60 having doping concentrations $N_1$, $N_2$ and $N_3$, respectively. The second zone 55 is situated proximate the lower portion 12a of the first layer 12 while the third zone 60 is situated proximate the second layer 14. The first zone 50 is situated between the second and third zones 55 and 60, respectively. It is preferred that $N_1$ be greater than $N_3$ and that $N_3$ be greater than $N_2$. In this embodiment, the second zone 55 can be more lightly doped to reduce the electric field flux at the corners 39 of the trench. A light doping concentration in this region may, for instance, facilitate the use of a uniform insulation layer 32 of a thickness in the order of 1,000–2,000 angstroms over the entire length of the trench 24 to simplify the fabrication process but still provide an acceptable gate characteristic. The third zone 60 is lightly to moderately doped to reduce the electric field adjacent the blocking junction 20 to reduce the possibility of breakdown at location A. The lengths of the first, second and third zones are $L_1$, $L_2$ and $L_3$, respectively and the length of the entire upper portion 12b of the first layer 12 is L. It is preferred that the sum of $N_1L_1$ and $N_2L_2$ and $N_3L_3$ divided by L is greater than $\epsilon E_{AV}^2/2qV$.

The first, second and third zones can be readily established by modifying the above-discussed method to provide for the establishment of a first layer by successive steps. For instance, the embodiment of FIG. 3C can be established by first providing the second zone 55 atop a partially processed wafer. The first zone 50 can be established by either epitaxial growth or doping. Subsequently, the third zone 60 can be established by either epitaxial growth or doping.

In analyzing the on-resistance of a device such as illustrated in FIGS. 3A, 3B or 3C, it is important to remember that the portion of the device within the pedestal is governed by equations (4–6) while the portion of the device outside the pedestal is governed by equation (1–3).

FIG. 3D is a plot of a typical electric field profile as might be associated with the device 10 of FIG. 3A. The electric field shown by the heavy line is substantially uniform across the pedestal portion of the first layer 12, shown as region $R_1$ in the plot which extends from the blocking junction 20, which is shown as the x=o point in FIG. 3D to the point $x=L_g$. Outside the pedestal the electric field drops off rapidly with a slope proportional to N over the second zone 55 of the device 10 of FIG. 3A, shown as region $R_2$, to become zero at the interface between the second zone 55 and the substrate region of the partially processed wafer at the point x=L.

The dashed line superimposed on FIG. 3D is intended to graphically illustrate the equivalent length of a drift region which would be required to support a similar field strength in the absence of the vertical charge control of the present invention. The slope of the dashed line for a conventional device according to equation 2 above is proportional to the inverse of the doping concentration. Thus, the total voltage supported by the device of FIG. 3A is the area of both regions $R_1$ and $R_2$. The benefit of using vertical charge control can be seen from the following example where we assume $L_g=L/2$.

$$V_T = V_1 + V_2$$

$$V_1 = E_1 L_g$$

$$V_2 = E_2(L - L_g)/2$$

$$V_1 = 2V_2$$

$$V_T = 3V_2$$

Thus, to support an equivalent voltage without vertical charge control, a doping concentration of approximately ⅓ the original doping concentration must be used over a drift region 50% longer. Moreover, since the on-resistance in a conventional device is proportional to length of the drift region and inversely proportional to the carrier concentration, the on-resistance is substantially greater.

$$R_{ON} \alpha \frac{W + W_T}{W} \frac{L_g}{N_1} + \frac{L - L_g}{N_2}$$

$$R_{ON} \alpha \frac{W + W_T}{W} \frac{L_g}{N_1} + \frac{L_g}{N_2} \quad (V_{BR} = 3V_2)$$

$$L_o = 3(L - L_g) \quad N_o = N_2/3 \text{ for } V = 3V_2$$

$$R_{ON} = \frac{9 L_g}{N_2}$$

Thus, the on-resistance of a device of equivalent breakdown voltage in the absence of charge control is nine times greater.

Figure 4:
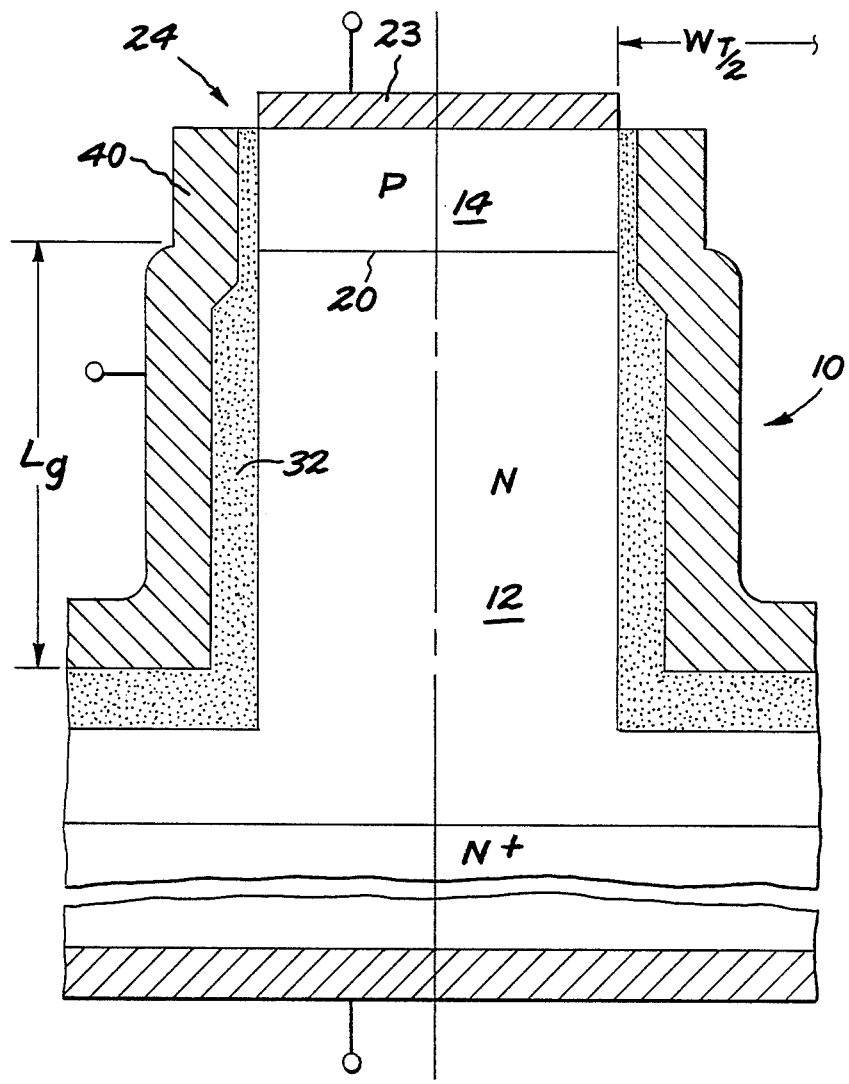
FIG. 4 is a cross-sectional illustration of a portion of a single cell of an alternate preferred embodiment of an improved conductivity semiconductor device in accordance with the present invention such as might be used in a diode implementation.

FIG. 4 is an illustration of the present invention as embodied in a PN diode 10 comprising a first layer 12 shown as an N type conductivity layer. A second layer 14 of one type conductivity, here P type, is disposed on the first layer 12 of opposite type conductivity, and a PN blocking junction 20 is formed therebetween. A trench 24 extends through the second layer 14 into and through a substantial portion of the first layer 12. It is preferred that the aspect ratio of the gate length $L_g$ to the trench width $W_T$ be at least 0.5. An insulation layer 32 is disposed within the trench 24 and a gate electrode 40 is disposed atop the insulation layer 32.

The device of FIG. 4 differs from that of FIG. 2 in that the FIG. 4 device omits the source or further region 19. Thus, the insulation layer 32 and the gate electrode 40 need not extend over the second layer 14 but in most commercial embodiments, the gate electrode 40 and the insulation layer 32 will overlap onto the second layer 14 as a process expedient. In this embodiment, a junction diode is formed between the first and second layers 12 and 14, respectively. A Schottky diode can alternatively be formed wherein the first and second layers 12 and 14 are of the same type conductivity and the electrode 23 makes Schottky or rectifying contact with the second layer 14. By using the vertical charge control structure of the present invention, the length of the pedestal portion of the drift layer can be substantially reduced. A diode fabricated in accordance with the present invention can be made half as thick as a conventional device yet still capable of supporting an equivalent breakdown voltage. The benefit of the thinner diode structure is that it reacts faster to the application of a bias voltage.

Figure 5:
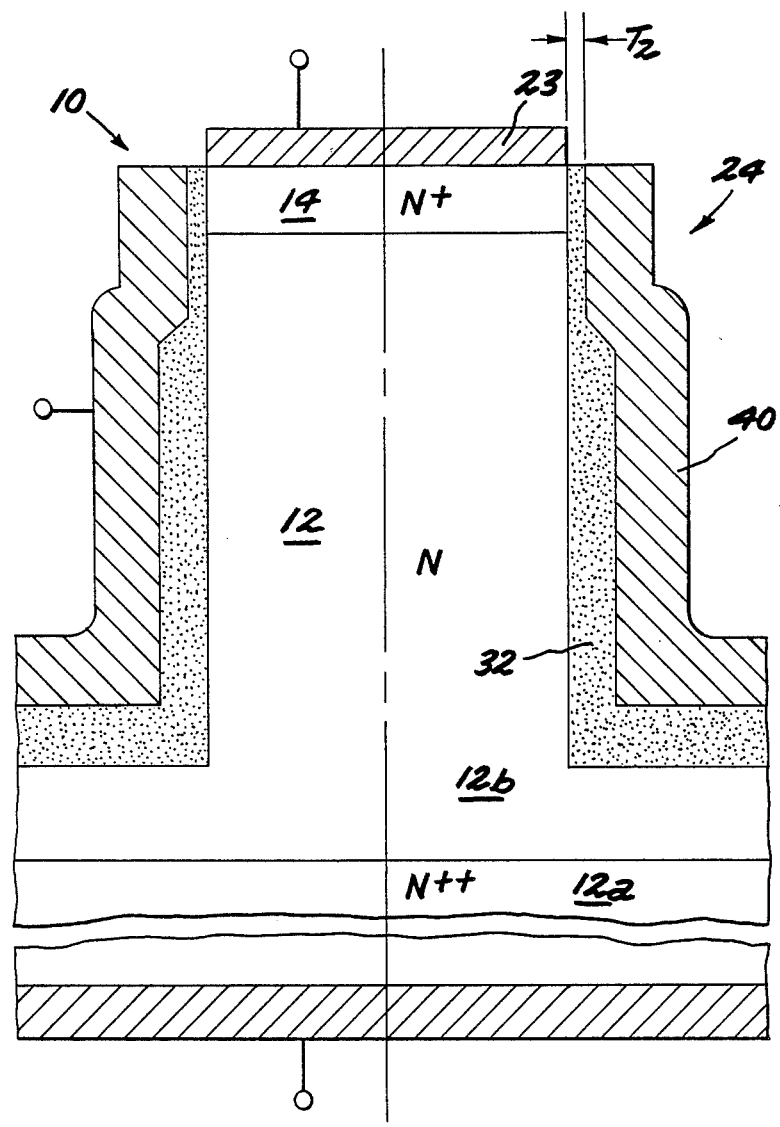
FIG. 5 is an illustration of an alternate preferred embodiment of the present invention as applied to a junction field effect transistor structure.

FIG. 5 is an illustration of a still further alternate embodiment of an improved conductivity vertical charge control device in accordance with the present invention. More particularly, the device 10 comprises a junction field effect transistor wherein the second layer 14 is of the same type conductivity type as the first layer 12 and is substantially more heavily doped than the first layer 12. The first layer 12 can alternatively be moderately doped in view of the vertical charge control provided by the gate electrode 40. Thus, in forward conduction, the device conducts with a reasonably low on-resistance and under reverse bias conditions, blocks a substantial level of voltage as a result of the vertical charge control provided by the gate electrode 40. It is noted that the on-resistance cannot be made exceedingly low by heavily doping the pedestal, because the gate electrode 40 must be able to deplete and pinch off the pedestal under reverse bias conditions. It is therefore preferred that the insulation layer 32 be non-uniform and include a thin portion $T_2$ proximate the pinch off region adjacent the interface between the first and second layers 12 and 14 respectively, and comprise a thick portion otherwise adjacent the upper portion 12b of first layer 12. Alternatively a structured upper portion 12b of the first layer 12, such as that shown in FIG. 3B, can be used to provide a junction field effect transistor device.

Figure 6:
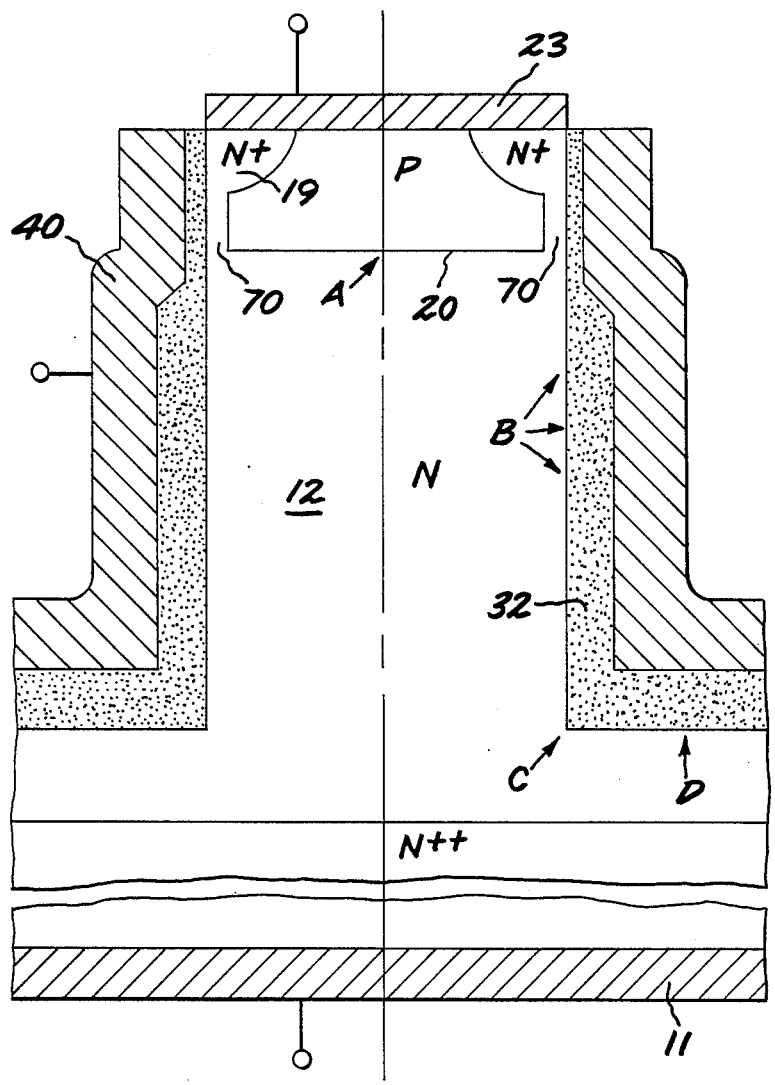
FIG. 6 is an illustration of an alternate preferred embodiment of the present invention as applied to a depletion mode field effect transistor.

Referring now to FIG. 6, the present invention is shown embodied in a depletion mode metal oxide semiconductor field effect transistor. In this embodiment, the further region 19 is directly connected to the first layer 12 by a channel 70 of N type conductivity material. The device 10 conducts in response to a bias potential applied between the electrodes 11 and 23. In response to an appropriate potential $V_{GOFF}$ applied to the gate electrode 40, the channel 70 is depleted and the device is prevented from conducting. The portion of first layer 12 within the pedestal continues to support to a high electric field and hence the breakdown voltage of the device is high. However, the polarity of $V_{GOFF}$ is such that it improves charge control, thus lowering peak field at region A, but adds to the gate drain potential which increases the fields at regions C and D. Corner breakdown is again a concern and it may be necessary to employ a thick insulation layer 32 adjacent the corner similar to the enhancement mode FET, or employ an alternate profile for the doping concentration of the first layer 12 as taught in connection with FIG. 3 above.

It should be noted that the junction field effect device can be fabricated with only a minor variation of the above-discussed method of fabrication. More particularly, after the first portion of the trench 24 has been etched, a doping, which preferably is a diffusion doping, is performed with an appropriate concentration of slow diffusing material to form the channel 70 within the second layer.

FIGS. 7A, 7B and 7C are illustrations of a top view of the trench 24 shown in three alternative embodiments of the present invention. More particularly, FIG. 7A shows a trench 24 which is substantially annular and surrounds the pedestal of the device 10.

In FIG. 7B, the trench 24 comprises two separate sections 80 and 85 disposed on opposed sides of the pedestal. In this embodiment, the insulated gates 40 partially surround, overlap and extend past the pedestal by a distance X which is greater than or equal to $L_g$, so that the pedestal is recessed within the trench. This allows charge control to apply to the lateral surface P-N junction. The extension allows the gate electrode 40 to provide charge control over the entire blocking junction 20 including the portion of the junction 20 which extends to the surface. In this embodiment, a vertical portion 20A of the junction 20 is also formed at the vertical interface between the first layer 12 and the second layer 14. If even a small portion of the pedestal is not subject to charge control, a breakdown path would be established and the charge control effect would be lost.

FIG. 7C is an illustration of an embodiment of the present invention wherein the pedestal width varies. Again, the pedestal portion of the first layer 12 is recessed within the gate electrodes 40 by a distance X which is approximately equal to or greater than $L_g$. The gate electrode only partially surrounds the pedestal. FIG. 7C illustrates that the present invention not only applies to those devices in which the pedestal width remains constant, but that it also applies to those devices in which the pedestal width varies. In one analysis of the present invention, the product of WN should remain constant. This end can be achieved by varying the doping concentration inversely with pedestal width W or alternatively selecting a maximum N carrier concentration in the drift layer sufficient to maintain the WN product within acceptable limits.

Figure 7E:
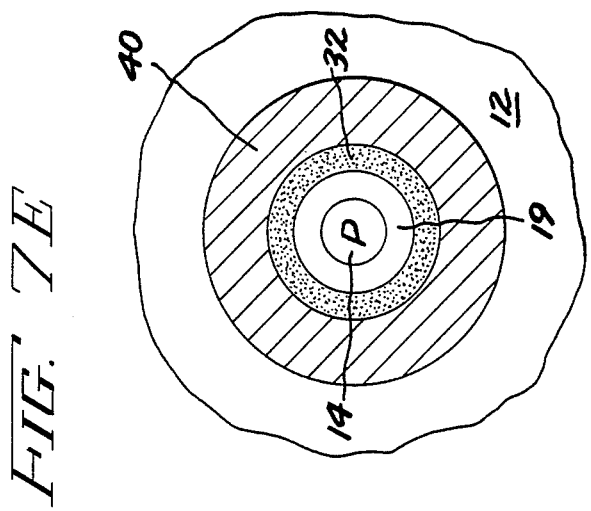
FIG. 7E is an illustration of a top view of a unit cell of a partially completed semiconductor device fabricated in accordance with a preferred embodiment of the present invention.
Figure 7D:
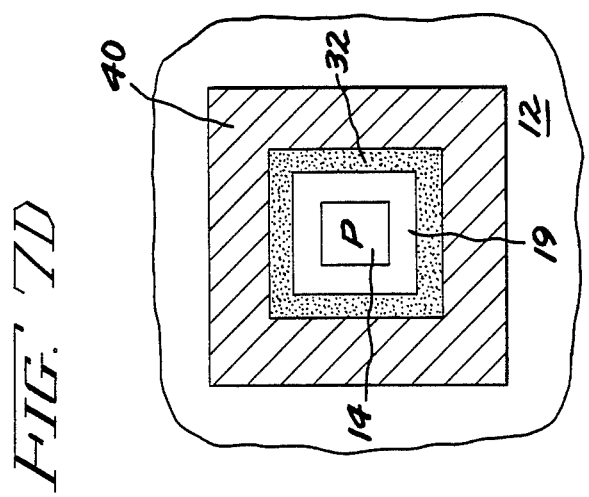
FIG. 7D is an illustration of a top view of a unit cell of a partially completed semiconductor device fabricated in accordance with a preferred embodiment of the present invention.

A further increase in the doping concentration and a concomitant reduction in on-resistance within the pedestal can be achieved by specially configuring the trench 24 and pedestal to maximize the carrier concentration within the pedestal. Specifically, if the trench and pedestal are fabricated substantially symmetrical when viewed from above as for instance, is shown in FIGS. 7D and 7E, the drift region carrier concentration can be increased by a factor of approximately two. In the example of a substantially cylindrical trench shown in FIG. 7E and a substantially cylindrical pedestal, the above equations 4 and 6 for on-resistance and carrier concentration can be rewritten as follows:

$$R_{ON} = \frac{(W + W_T)^2}{W^2}$$

$$N = \frac{8\epsilon E_{AV}}{qW}$$

FIG. 8, comprising plots A-F, is an illustration of the effect on electric field of varying various parameters of the device 10 shown in FIGS. 2-6 having a drift region length L of approximately 10 microns. FIGS. 8A, 8B and 8C illustrate the effect on electric field of varying the location $Y_1$ of the transition region 35 of the insulation layer 32 as shown in FIG. 2A, for example, while FIGS. 8D, 8E and 8F illustrate the effect on electric field of varying the thickness $T_1$ of the first portion 34 of the insulating layer 32 adjacent the first layer 12, as shown in FIG. 2A, for example.

Figure 8A:
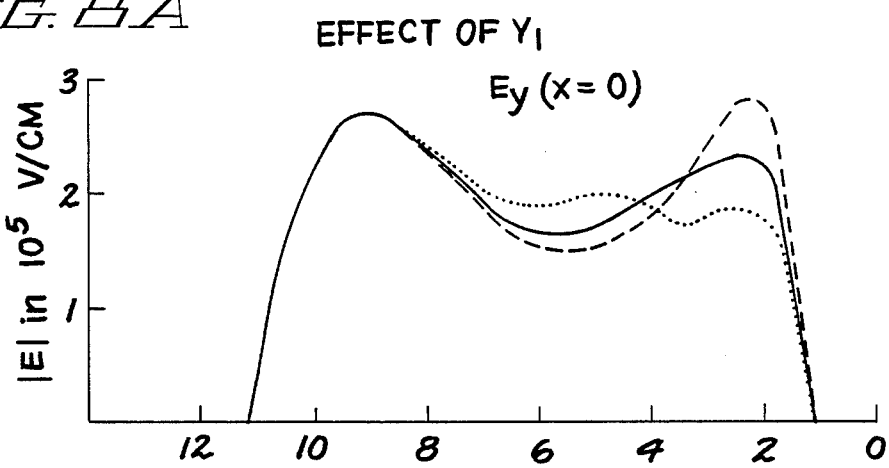
FIGS. 8A, 8B and 8C are plots of data indicating the effect on electric field of varying the depth, measured relative to the blocking junction, at which the thickness of the insulation layer is changed from a thin oxide to a thick oxide in the device shown in FIG. 2.
Figure 8B:
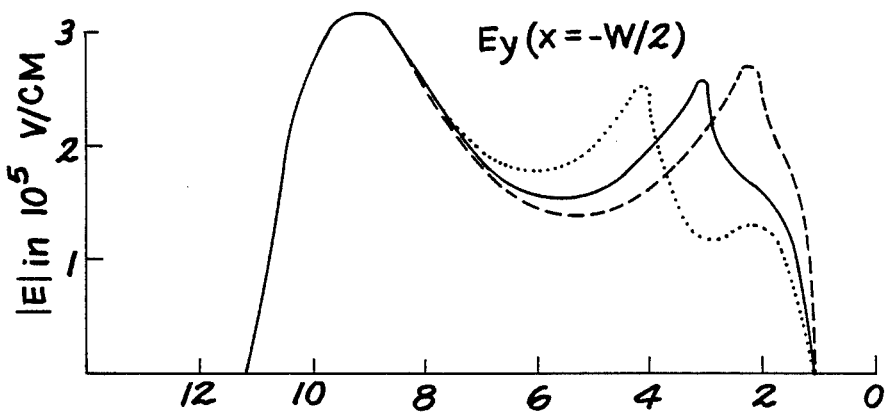
Figure 8C:
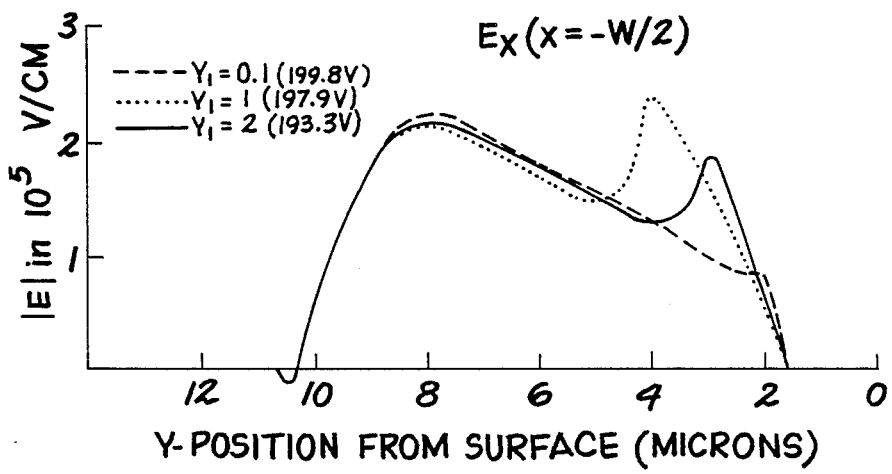

The position $Y_1$ of the oxide transition region 35, measured relative to the blocking junction 20 of the device 10 can affect the electric field developed within the device. The calculated data plots of FIGS. 8A, 8B and 8C illustrate the effect on electric field of positioning the transition region 35 at various separations from center line of the blocking junction 20 of the device 10 as shown in FIG. 2A, for example. Electric field effects were determined for a transition region 35 separated from the blocking junction 20 by a distance of 0.1, 1 and 2 microns for break-down voltages of 199.8 volts, 197.9 volts and 193.3 volts, respectively. The electric field was analyzed along the cell pedestal center line x=o, along the silicon oxide interface x=-w/2 and normal to the silicon oxide interface at x=-w/2 in FIGS. 8A, 8B and 8C, respectively for various values Y measured from the surface of the device. Thus, increasing the separation $Y_1$ between the blocking junction 20 and the transition region 35 to approximately 1 micron minimized the vertical electric field at the center line x=o and at sidewall x=W/2, but increased the lateral electric field at the channel sidewall. Inasmuch as the lateral electric field does not adversely impact upon breakdown voltage, a transition region separation $Y_1$ of approximately 1 micron can be used in a preferred embodiment of the present invention provided of course that an appropriate oxide thickness is also provided.

Figure 8D:
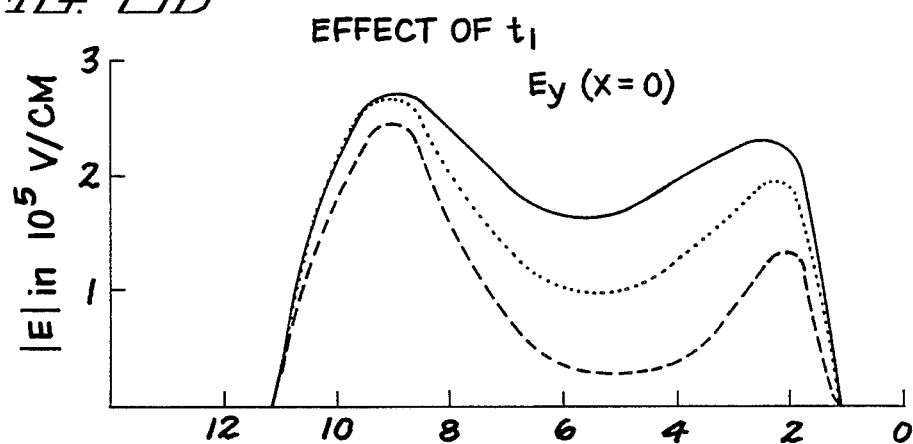
FIGS. 8D, 8E and 8F are illustrations of data plots which indicate the effect on electric field of increasing the thickness of the insulation layer adjacent the first layer in the device shown in FIG. 2.
Figure 8E:
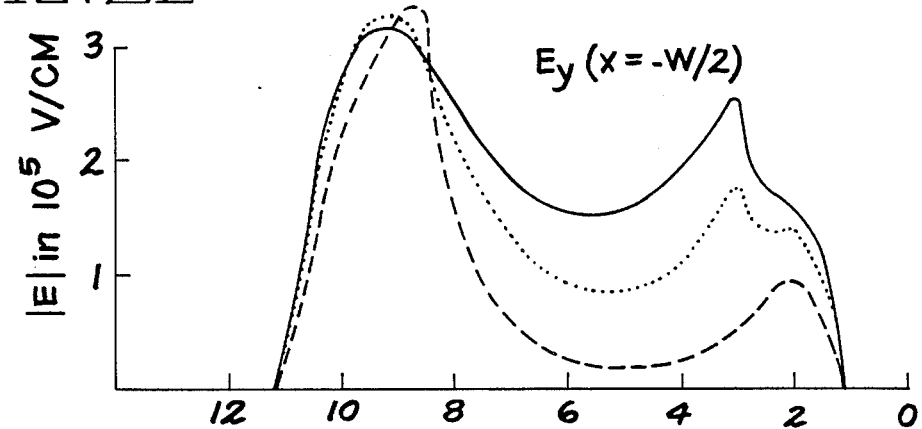
Figure 8F:
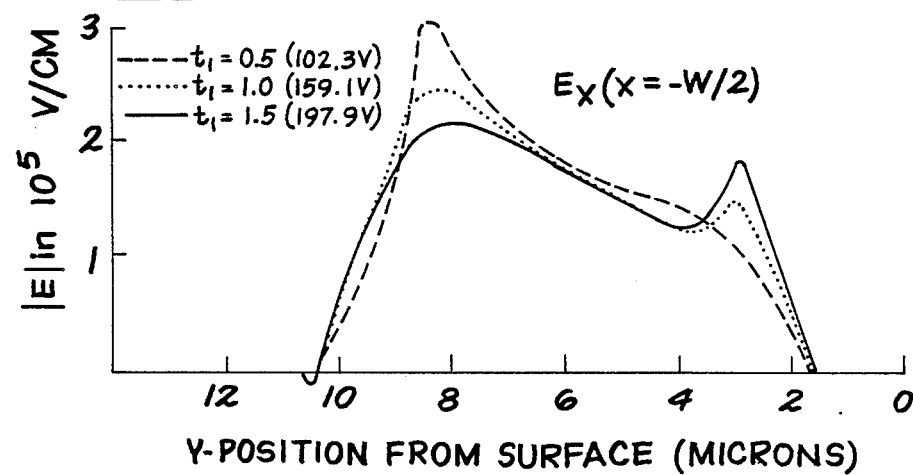

In FIGS. 8D, 8E and 8F, the effect on the internal electric field of varying the thickness $T_1$ of the first portion 34 of the gate insulation 32 adjacent the first layer 12 of device 10, as shown in FIG. 2A, for example, is analyzed along the center line of the pedestal at x=o, in FIG. 8D, along the silicon-oxide interface at x=W/2 in FIG. 8E and normal to the silicon-oxide interface at x=w/2 in FIG. 8F for gate insulation thicknesses of 0.5, 1, and 1.5 microns and breakdown voltages of 102.3 volts, 159.1 volts and 197.9 volts, respectively. Clearly, a thinner insulation layer 32 effectively couples and reorients a greater proportion of the vertical component of the electric field within the pedestal, but less effectively couples and reorients the electric field near the trench corner. Thus, it is particularly desirable to provide a thick third portion 38 of the insulation layer 32. As discussed above, this can be accomplished by damaging the trench bottom to promote oxide growth.

FIG. 9 illustrates the effect on breakdown voltage $V_{BD}$ of increasing the doping concentration, $N_{CC}$, in a 200 volt breakdown voltage device, such as shown in FIG. 2A, wherein the first portion 34 of the insulation layer 32 has a thickness $T_1$ of approximately 0.5 microns, the second portion 36 of the insulation layer 32 has a thickness $T_2$ of approximately 1.5 microns and the third portion 38 of the insulation layer 32 located at the bottom of the trench 24 has a thickness $T_B$ of approximately 1.7 microns. The transition portion 35 is located 1.1 microns beneath the blocking junction 20. Three separate embodiments are analyzed in which the half-pedestal width W/2 is approximately equal to 4, 2, 1 micrometers, respectively. The trench length $L_t$ is approximately equal to 8.5 micrometers. Those skilled in the art will recognize that larger cells can support larger dopant concentrations. Each particular cell exhibits a peak concentration past which the breakdown voltage of the device begins to decrease. Each particular cell is limited by its geometry, and in the particular illustrated example each cell is limited by the breakdowns which occur at the trench corner. When the gate bias $V_G$ exceeds the source bias $V_S$, the maximum carrier concentration is reduced. Alternatively, when the gate bias $V_G$ is less than the sources potential $V_S$, the maximum carrier concentration can be increased. The carrier concentration can be increased even further, but it should be noted that even aside from breakdown voltage considerations, the maximum carrier concentration will be P-N junction limited.

Figure 10:
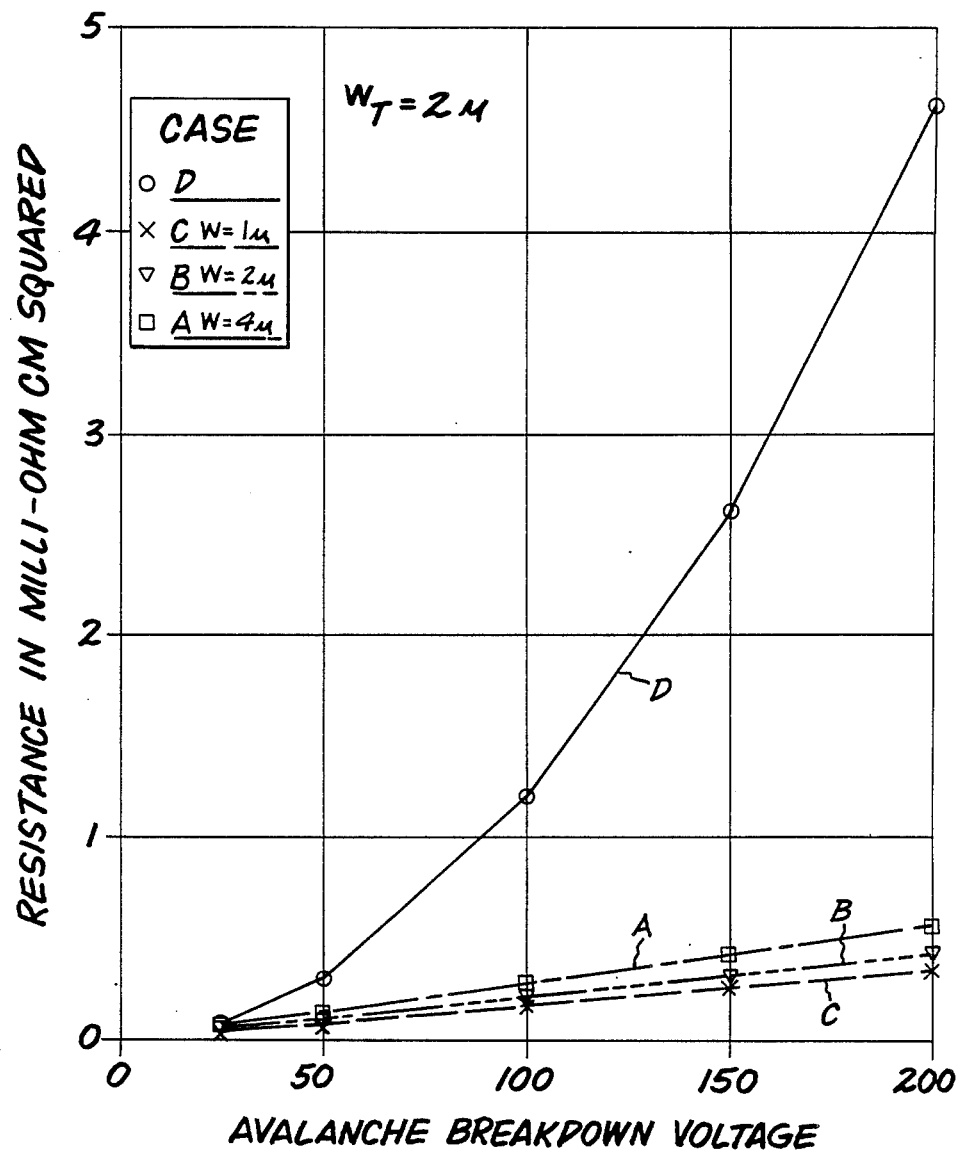
FIG. 10 is a plot of calculated minimum value of drift region on-resistance contribution to the device resistance versus the voltage characteristics for the device of the present invention for several values of W as contrasted with a similar plot for a conventional device.

Referring now to FIG. 10, a plot of the projected total on-resistance versus the avalanche breakdown voltage in various vertical channel field effect transistor devices is shown. From the data shown in this figure, it can be seen that a significant improvement in on-resistance in the device can be achieved using even modestly optimized vertical channel charge control structures. The present invention allows the on-resistance of the device to be reduced by as much as two-thirds when compared to a conventional device of similar breakdown voltage.

Curves A, B and C illustrate the on-resistance for the device of the present invention having 1 micron, 2 micron and 4 micron pedestals widths respectively, and a 2 micron trench width. The ratio of W/WT is 0.5, 1 and 2 for curves A, B, and C, respectively. The analysis assumes ideal resistance, no channel, spreading, contact or substrate resistance.

Curve D shows a typical conventional device which exhibits substantially higher on-resistance.

It is to be recognized that while the preferred embodiment of the present invention has been disclosed with respect to diodes, junction field effect transistors, and enhancement and depletion mode field effect transistors, the preferred embodiments of the present invention are not so limited. The improved conductivity low on-resistance vertical channel insulated-gate semiconductor device structure of the present invention has broad application and can be used with a variety of different vertical devices to improve the conductivity of the device as a whole and is particularly applicable to those devices which must block substantial voltages. Further, while the above discussed examples treat a single cell in particular, a device in accordance with the present invention comprises a plurality of cells. It is recognized that the improved channel conductivity device of the present invention allows a reduction in cell width and hence a reduction in cell repeat distance contributing to a higher cell packing density which further contributes to an increased current density per unit area.

Thus, a semiconductor device has been provided in which the length of the voltage supporting region can be reduced by approximately half regardless of the type device under consideration. Bipolar and MOS devices can be fabricated in which the length of the drift regions is approximately half the length of the drift region in a conventional device. A reduced drift length translates to a device with a low forward drop or a higher speed device for an equivalent breakdown voltage. These benefits are particularly important in devices which do not require large blocking voltages. Thus, insulated gate transistors can be fabricated with lower forward drops and MOS controlled thyristors can be fabricated with higher peak controllable voltages.

While the preferred embodiment of the present invention has been illustrated and described, it is clear that the present invention is not so limited. Numerous modifications and changes, variations and substitutions and equivalents will occur to those skilled in the art without departing from the true spirit and scope of the present invention. Accordingly, it is intended that the invention herein be limited only by the scope of the appended claims.

What is claimed is:

1. A semiconductor device comprising:
   a body of semiconductor material having first and second opposed major surfaces and including:
      a drift layer of semiconductor material exhibiting a concentration X of dopant impurities therein;
      a second layer of semiconductor material between said drift layer and said first major surface;
   a trench extending into said body from said first major surface through said second layer and extending a distance $L_t$ into said drift layer to define a pedestal portion of said body having a width W and including portions of said drift and second layers, said drift layer portion of said pedestal having an aspect ratio $L_t/W$ which is greater than or equal to 0.5, an area charge density of WX greater than or equal to $\epsilon E_{AV}/2q$, wherein $\epsilon$ is the permittivity of the semiconductor material, $E_{AV}$ is the electric field strength at avalanche breakdown and q is the electron charge;
   means associated with said drift layer portion of said pedestal for diverting electric field lines originating with said dopant impurities of said drift layer portion of said pedestal to thereby increase the voltage supporting potential of said drift layer portion of said pedestal and said device; and
   a first main electrode disposed on said first major surface in ohmic contact therewith; and
   a second main electrode disposed on said second major surface in ohmic contact therewith;
   the main ON-state current path through said device extending between said first and second main electrodes and, when said device is in said ON-state, said pedestal portion of said drift layer is free of inversion layers.

2. The semiconductor device of claim 1 wherein said second layer is doped with one type conductivity impurities and said drift layer is doped with opposite type conductivity impurities, whereby a first PN junction is formed between said drift and second layers and wherein said device further includes:
   a further region of opposite type conductivity disposed in said second layer portion of said pedestal and in ohmic contact with said second main electrode; and
   an insulated gate disposed in said trench proximate said second layer;
   wherein:
   said insulated gate, in response to an appropriate bias, induces a channel in said second layer for conductively coupling opposite type conductivity carriers through said second layer between said further region and said drift layer;
   said first PN junction is a voltage blocking junction in the off-state of said device when the voltage applied across said first and second main electrodes is of one polarity.

3. The semiconductor device of claim 2 wherein said second layer is doped with one type conductivity impurities and said drive layer is doped with opposite type conductivity impurities, whereby a first PN junction is formed between said drift and second layer and wherein said device further includes:
   a further region of opposite type conductivity disposed in said second layer portion of said pedestal and in ohmic contact with said second main electrode; and
   an insulated gate disposed in said trench proximate said second layer;
   said means associated with said drift layer portion of said pedestal comprises an insulated gate substantially coextensive with said trench;
   said insulated gate, in response to an appropriate bias, inducing a channel in said second layer for conductively coupling opposite type conductivity carriers through said second layer between said further region and said drift layer.

4. The semiconductor device of claim 3 wherein when a bias potential is applied across said first and second main electrodes of a plurality to reverse bias said first PN junction, and said gate electrode is biased at substantially the same potential as said second main electrode.

an imaginary, equipotential, surface within said pedestal is situated in said drift layer where each point on said equipotential surface is substantially equidistant from said insulated gate and said first junction and at its deepest penetration into said pedestal extends to a depth $L_V$ into said drift layer, $L_V$ being measured from said first junction; and said trench and insulated gate extend to a depth measured from said first junction which is greater than $L_V$.

5. The semiconductor device of claim 3 wherein said extension of said insulated gate electrode comprises an insulation layer disposed in said trench adjacent said drift layer and a gate electrode disposed in said trench adjacent said insulation layer.

6. The semiconductor device of claim 5 wherein said gate comprises a conductor selected from the group consisting of metal silicates and refractory metals.

7. The semiconductor device of claim 5 wherein said gate electrode substantially fills said trench.

8. The semiconductor device of claim 5 wherein said trench comprises a bottom adjacent said drift layer and said insulation layer comprises N portions, an $N^{th}$ portion of said insulation layer disposed proximate said bottom and exhibiting a thickness $T_N$ and an $N\text{-}1^{th}$ portion of said insulation layer being more proximate said first surface than said $N^{th}$ portion is, said $N\text{-}1^{th}$ portion exhibiting a thickness $T_{N-1}$, wherein $T_N$ is greater than $T_{N-1}$.

9. The semiconductor device of claim 8 wherein said trench includes a bottom surface and wherein a bottom portion of said insulation layer overlies said bottom surface and said bottom portion exhibits a thickness $T_B$ wherein $T_B$ is greater than $T_N$.

10. The semiconductor device of claim 2 wherein said means associated with said drift layer of said pedestal comprises a second insulated gate extending in said trench over a substantial portion of said trench proximate said drift layer.

11. The semiconductor device of claim 10 wherein said second insulated gate is discrete from said first insulated gate.

12. The semiconductor device of claim 10 wherein said second insulated gate comprises a plurality of discrete insulated gate portions.

13. The semiconductor device of claim 10 wherein said second insulated gate comprises a second insulation layer disposed adjacent said drift layer and a second gate electrode disposed thereon.

14. The semiconductor device of claim 10 wherein said second gate comprises polysilicon.

15. The semiconductor device of claim 10 wherein said gate electrode comprises a conductor selector from the group consisting of metal silicides and refractory metals.

16. The semiconductor device of claim 10 wherein said means associated with said drift layer portion of said pedestal includes means for coupling said second insulated gate electrode to a source of bias potential.

17. The semiconductor device of claim 1 wherein said second layer is doped with one type conductivity impurities and said drift layer is doped with opposite type conductivity type impurities, said device further including an insulated gate disposed in said trench proximate said second layer, said insulated gate, in response to an appropriate applied bias, depleting carriers from said pedestal portion of said second layer to prevent current flow through said second layer.

18. The semiconductor device of claim 17 wherein said insulated gate is substantially coextensive with said trench.

19. The semiconductor device of claim 18 wherein said trench extends through greater than 50% of the depth of said drift layer.

20. The semiconductor device of claim 19 wherein said insulated gate electrode comprises an insulation layer disposed in said trench adjacent said drift layer and a gate electrode is disposed in said trench adjacent said insulation layer.

21. The semiconductor device of claim 20 wherein said gate electrode comprises polysilicon.

22. The semiconductor device of claim 20 wherein said gate electrode comprises a conductor selected from the group consisting of metal silicides and refractory metals.

23. The semiconductor device of claim 20 wherein said gate electrode substantially fills said trench.

24. The semiconductor device of claim 20 wherein said trench comprises a bottom adjacent said drift layer and said insulation layer comprises N portions, an $N^{th}$ portion of said insulation layer being disposed proximate said bottom and exhibiting a thickness of $T_N$ and an $N\text{-}1^{th}$ portion of said insulation layer being more proximate said first surface than said $N^{th}$ portion is, said $N\text{-}1^{th}$ portion exhibiting a thickness $T_{N-1}$, wherein $T_N$ is greater than $T_{N-1}$.

25. The semiconductor device of claim 20 wherein said trench includes a bottom surface and wherein a bottom portion of said insulation layer overlies said bottom portion of said insulation layer overlies said bottom surface and said bottom portion exhibits a thickness $T_B$ wherein $T_B$ is greater than $T_N$.

26. The semiconductor device of claim 2 wherein said means associated with said drift layer portion of said pedestal comprises a second insulated gate extending in said trench over a substantial portion of said trench proximate said drift layer.

27. The semiconductor device of claim 26 wherein said second insulated gate is discrete from said first insulated gate.

28. The semiconductor device of claim 26 wherein said second insulated gate comprises a plurality of discrete insulated gate portions.

29. The semiconductor device of claim 26 wherein said second insulated gate comprises a second insulation layer disposed adjacent said drift layer and a second gate electrode disposed thereon.

30. The semiconductor device of claim 26 wherein said second gate comprises polysilicon.

31. The semiconductor device of claim 26 wherein said second gate electrode comprises a conductor selected from the group consisting of metal silicides and refractory metals.

32. The semiconductor device of claim 26 wherein said means associated with said drift layer portion of said pedestal includes means for coupling said second insulated gate to a source of bias potential 33. The semiconductor device of claim 1 wherein said means associated with said drift layer portion of said pedestal is disposed within said trench.

34. The semiconductor device of claim 1 wherein said trench partially surrounds said pedestal.

35. The semiconductor device of claim 1 wherein said trench surrounds said pedestal.

36. The semiconductor device of claim 1 wherein W is greater than $E_{AV}/2qV_B$.

37. The semiconductor device of claim 1 wherein X is greater than $\epsilon(E_{AV})^2/2qV_B$.

38. The semiconductor device of claim 1 wherein X is approximately equal to $\epsilon E_{AV}/W$.

39. The semiconductor device of claim 1 wherein X is less than $\epsilon E_{AV}/W$.

40. The semiconductor device of claim 1 wherein said drift layer of said pedestal comprises a first zone disposed atop a second zone, said first zone exhibiting a doping concentration of $X_1$ and being disposed entirely within said pedestal and said second zone exhibiting a doping concentration of $X_2$, a portion of said second zone being disposed within said pedestal wherein $X_1$ is greater than $X_2$.

41. The semiconductor device of claim 40 wherein drift layer has a length L parallel to the height of said pedestal, said first zone has a length $L_1$, said second zone has a length $L_2$ and wherein $L_1+L_2+L$ and the sum of $X_1L_1$ and $X_2L_2$ divided by is greater than $\epsilon(E_{AV})^2/2qV_B$.

42. The semiconductor device of claim 41 wherein another portion of said second zone extends beneath said trench.

43. The semiconductor device of claim 42 wherein said drift layer further comprises a third zone, said third zone being disposed atop said first zone.

44. The semiconductor device of claim 43 wherein said third zone exhibits a doping concentration of $X_3$ and wherein $X_3$ is less than $X_1$.

45. The semiconductor device of claim 44 wherein said drift layer has a length L parallel to the height of said pedestal, said first zone has a length $L_1$, said second zone portion exhibits a length $L_2$ and said third zone portion exhibits a length $L_3$, and wherein the sum of $X_1L_1$, $X_2L_2$ and $X_3L_3$ divided by L is greater than $\epsilon(E_{AV})^2/2qV_B$.

46. The semiconductor device of claim 45 wherein $L_1$ is substantially greater than $L_2$.

47. The semiconductor device of claim 1 wherein said drift layer portion of said pedestal comprises a first zone and a second zone, said first zone being adjacent said second layer and exhibiting a doping concentration of $X_1$, and said second zone exhibiting a doping concentration of $X_2$ where $X_1$ is less than $X_2$.

48. The semiconductor device of claim 47 wherein said first zone exhibits a length $L_1$ parallel to the height of said pedestal, said second zone exhibits a length $L_2$, wherein $L_1$ substantially greater than $L_2$.

49. The semiconductor device of claim 48 (8) wherein said drift layer exhibits a length L equal to $L_1+L_2$ and the sum of $X_1L_1$ plus $X_2L_2$ divided by L is greater than $\epsilon(E_{AV})^2/2qV$.

50. A semiconductor device comprising:
a body of semiconductor material including first, second and third zones having alternating conductivity types, said first and third zones being of one type conductivity, said second zone being of an opposite type conductivity and forming first and second PN junctions with said first and third zones, respectively;
said body of semiconductor material having first and second opposed major surfaces, said first major surface being comprised of a portion of said first zone and a portion of said second zone, said body having a substantially vertical trench extending into said body from said first major surface and through said first and second zones and into the third zone to define a pedestal portion of said body including portions of said first, second and third zones, said trench extending a length $L_t$ into said third zone, said third zone portion of said pedestal having a width W and an aspect ratio of $L_t/W$ which is greater than or equal to 0.5 throughout said pedestal;
an insulation layer disposed in said trench on said portions of said first, second and third zones exposed by said trench;
a gate electrode disposed in said trench adjacent said insulation layer and coextensive with said second zone and extending past said second junction and substantially covering said exposed portion of said third zone;
a first main electrode disposed on said first major surface in ohmic contact with said first zone; and
a second main electrode disposed on said second major surface in ohmic contact therewith;
the main ON-state current path through said device extending between said first and second main electrodes.

51. The semiconductor device of claim 50 further including means for coupling said gate electrode to an off-state bias potential for, in response to an off-state bias potential of appropriate polarity and magnitude, coupling the electric field associated with a substantial portion of said third zone portion of said pedestal to said gate electrode in a manner to increase the reverse breakdown voltage of said device.

52. The semiconductor device of claim 51 wherein said third zone is heavily doped.

53. The semiconductor device of claim 51 wherein said trench, insulation layer and gate electrode overlap at least 50% of said exposed portion of said third zone.

54. The semiconductor device of claim 51 wherein said gate electrode comprises first and second portions, said first portion being coextensive with at least said second zone and said second portion being coextensive with a substantial portion of said third zone.

55. The semiconductor device of claim 51 wherein said trench includes a bottom surface, and said insulation layer and said gate electrode overlie said bottom surface of said trench.

56. The gate semiconductor device of claim 51 wherein said trench includes a smoothly rounded corner.

57. The semiconductor device of claim 51 wherein said first main electrode is disposed in ohmic electrical contact with said second zone, said first main electrode thereby shorting said first PN junction at said first major surface.

58. The semiconductor device of claim 51 further including a fourth zone of opposite type conductivity adjacent said third zone and forming a third PN junction therewith.

59. The semiconductor device of claim 51 wherein said insulation layer comprises a first portion having a thickness $T_2$ proximate said second zone and a second portion having a thickness $T_3$ proximate said second junction and said third zone wherein $T_3$ is greater than $T_2$.

60. The semiconductor device of claim 51 wherein said insulation layer comprises N portions wherein the $N^{th}$ portion is deep within the trench adjacent said third zone and an $N-1^{th}$ portion is closer to the first major surface than said $N^{th}$ portion is and exhibits a thickness $T_{N-1}$ and the $N^{th}$ portion exhibits a thickness $T_N$, and wherein $T_N$ is greater than $T_{N-1}$.

61. The semiconductor device of claim 51 wherein said insulation layer includes a transition region wherein the thickness of said insulation layer gradually increases from a thickness $T_2$ adjacent said second zone to a thickness $T_3$ adjacent said third zone.

62. The semiconductor device of claim 1 wherein:

said drift and second layers are both doped to one conductivity type; and said second layer is more heavily doped than said drift layer.

63. The semiconductor device of claim 58 wherein said second main electrode is disposed in ohmic contact with said fourth zone.

* * * * *